US010989741B2

United States Patent
Shimizu et al.

(10) Patent No.: US 10,989,741 B2
(45) Date of Patent: Apr. 27, 2021

(54) CURRENT SENSOR

(71) Applicant: Murata Manufacturing Co., Ltd., Nagaokakyo (JP)

(72) Inventors: Yasuhiro Shimizu, Nagaokakyo (JP); Noritaka Kishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 235 days.

(21) Appl. No.: 16/261,670

(22) Filed: Jan. 30, 2019

(65) Prior Publication Data
US 2019/0154735 A1 May 23, 2019

Related U.S. Application Data

(63) Continuation of application No. PCT/JP2017/021188, filed on Jun. 7, 2017.

(30) Foreign Application Priority Data

Nov. 17, 2016 (JP) .............................. JP2016-224273

(51) Int. Cl.
*G01R 15/20* (2006.01)
*G01R 19/32* (2006.01)

(52) U.S. Cl.
CPC ............. *G01R 15/20* (2013.01); *G01R 19/32* (2013.01)

(58) Field of Classification Search
None
See application file for complete search history.

(56) References Cited

U.S. PATENT DOCUMENTS

| 6,362,618 | B1 | 3/2002 | Motz |
| 2004/0080308 | A1 | 4/2004 | Goto |
| 2005/0073293 | A1* | 4/2005 | Hastings ............... G01R 15/202 324/117 H |
| 2007/0257659 | A1 | 11/2007 | Nomoto et al. |
| 2011/0298454 | A1* | 12/2011 | Ausserlechner ....... G01R 19/00 324/252 |

(Continued)

FOREIGN PATENT DOCUMENTS

| JP | 2004-152789 A | 5/2004 |
| JP | 2006-184269 A | 7/2006 |

(Continued)

OTHER PUBLICATIONS

Official Communication issued in International Patent Application No. PCT/JP2017/021188, dated Aug. 22, 2017.

*Primary Examiner* — Jas A Sanghera
(74) *Attorney, Agent, or Firm* — Keating & Bennett, LLP

(57) ABSTRACT

A current sensor outputs an output voltage in accordance with a magnitude of a current to be measured. The current sensor includes a conductor through which a current flows, magnetic sensors, and correctors. The magnetic sensors detect a strength of a magnetic field generated by the current and output an output voltage corresponding to the strength of the magnetic field as the output voltage from the current sensor. The correctors each correct fluctuations in magneto-electric conversion gains of the magnetic sensors caused by a change in an ambient temperature and fluctuations in the output voltages from the magnetic sensors caused by deformation of the conductor due to a change in the ambient temperature.

20 Claims, 30 Drawing Sheets

(56) References Cited

U.S. PATENT DOCUMENTS

| | | | |
|---|---|---|---|
| 2012/0086442 A1* | 4/2012 | Haas | G01R 33/0041 |
| | | | 324/225 |
| 2015/0115937 A1 | 4/2015 | Fujita et al. | |
| 2015/0309078 A1 | 10/2015 | Ausserlechner | |

FOREIGN PATENT DOCUMENTS

| | | |
|---|---|---|
| JP | 2007-278938 A | 10/2007 |
| WO | 2014/002387 A1 | 1/2014 |

\* cited by examiner

CURRENT SENSOR

CROSS REFERENCE TO RELATED APPLICATIONS

This application claims the benefit of priority to Japanese Patent Application No. 2016-224273 filed on Nov. 17, 2016 and is a Continuation Application of PCT Application No. PCT/JP2017/021188 filed on Jun. 7, 2017. The entire contents of each application are hereby incorporated herein by reference.

BACKGROUND OF THE INVENTION

1. Field of the Invention

The present invention relates to a current sensor that detects a magnitude of a current to be measured by detecting a strength of a magnetic field generated by the current.

2. Description of the Related Art

Japanese Unexamined Patent Application Publication No. 2007-278938 discloses a current sensor including a magnetic detector that detects the strength of a magnetic field generated by a current flowing through a busbar. This current sensor also includes a temperature detector and a temperature compensator. The temperature detector detects the ambient temperature. Based on the temperature detected by the temperature detector, the temperature compensator corrects errors of the magnetic detector caused by the temperature dependence of the magnetic detector.

SUMMARY OF THE INVENTION

Preferred embodiments of the present invention provide current sensors that are each able to reduce output errors caused by an ambient temperature change to be smaller than the related art.

A current sensor according to a preferred embodiment of the present invention outputs an output signal in accordance with a magnitude of a current to be measured. The current sensor includes a conductor through which the current flows, a magnetic device, and a corrector. The magnetic device detects a strength of a magnetic field generated by the current and outputs an electric signal corresponding to the strength of the magnetic field as the output signal. The corrector corrects fluctuations in a magneto-electric conversion gain of the magnetic device caused by a change in an ambient temperature and fluctuations in the electric signal of the magnetic device caused by deformation of the conductor due to a change in the ambient temperature.

According to preferred embodiments of the present invention, it is possible to reduce output errors caused by an ambient temperature change to be smaller than the related art.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
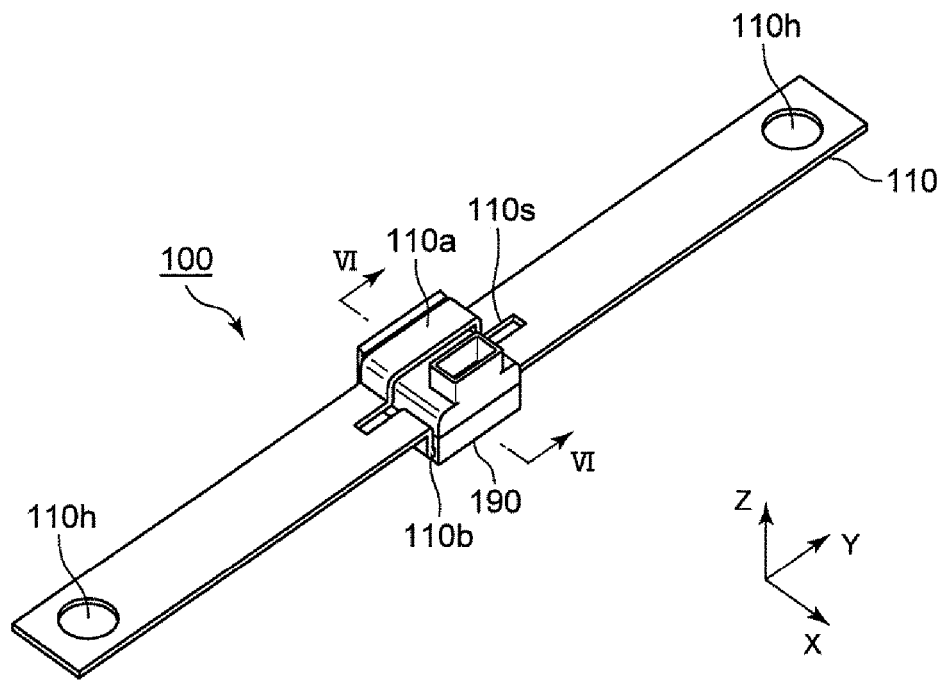
FIG. 1 is a perspective view illustrating the external appearance of a current sensor according to a first preferred embodiment of the present invention.

Current sensors according to preferred embodiments of the present invention will be described below with reference to the accompanying drawings. In the individual drawings, the same elements or corresponding elements are designated by the same reference numeral.

First Preferred Embodiment

A current sensor according to a first preferred embodiment will be described below with reference to FIGS. 1 through 13.

Figure 2:
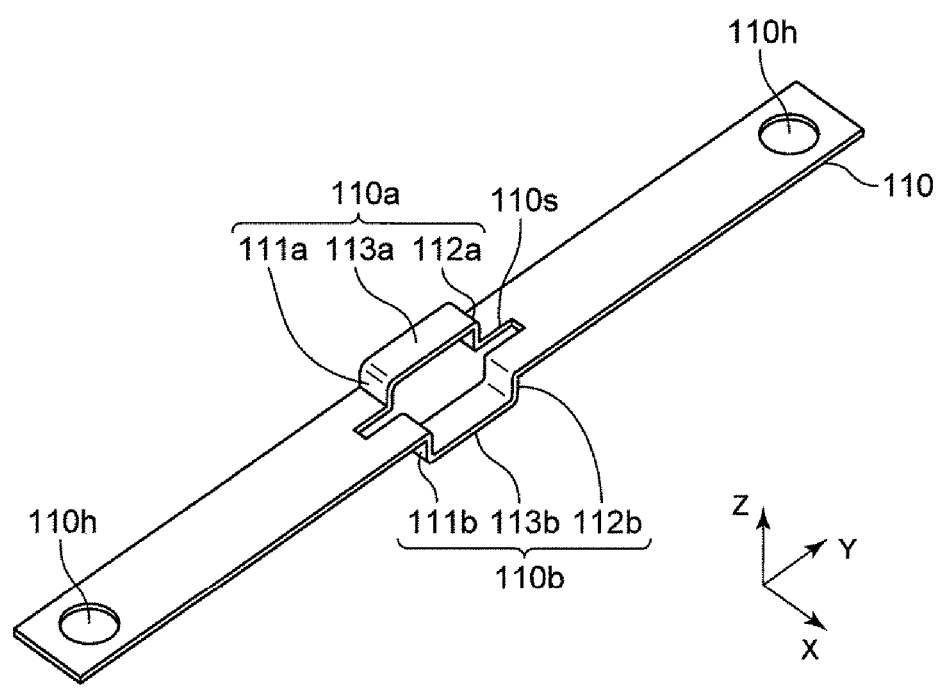
FIG. 2 is a perspective view illustrating the external appearance of a conductor of the current sensor shown in FIG. 1.
Figure 3:
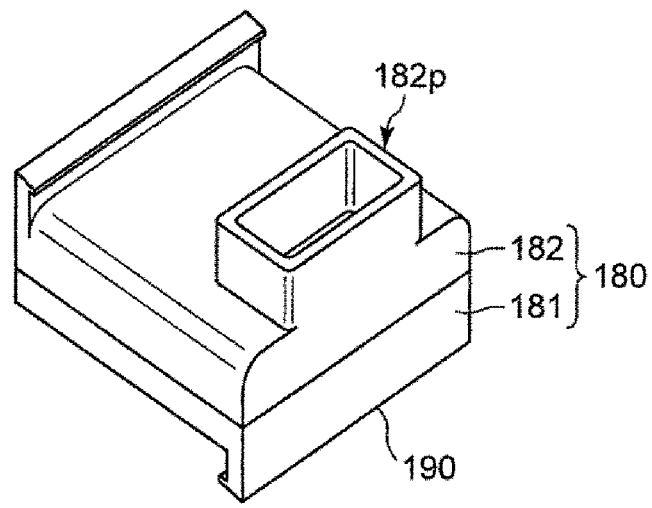
FIG. 3 is a perspective view illustrating the external appearance of a magnetic sensor unit of the current sensor shown in FIG. 1.
Figure 4:
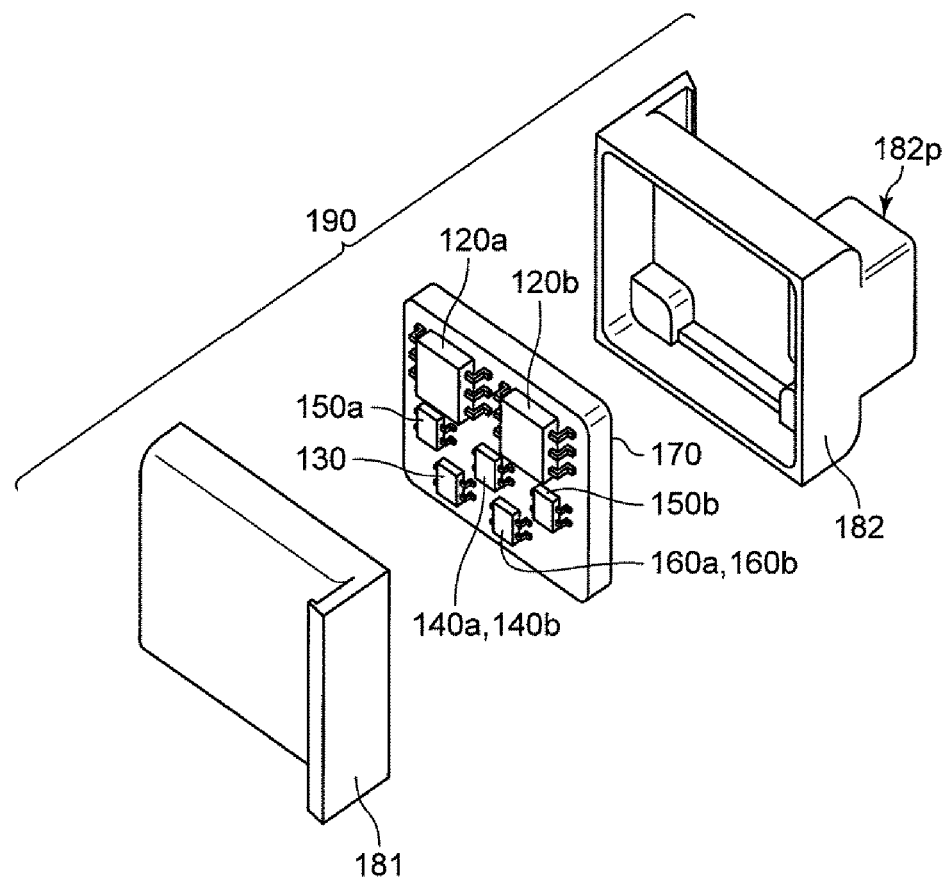
FIG. 4 is an exploded perspective view illustrating the configuration of the magnetic sensor unit shown in FIG. 3.
Figure 5:
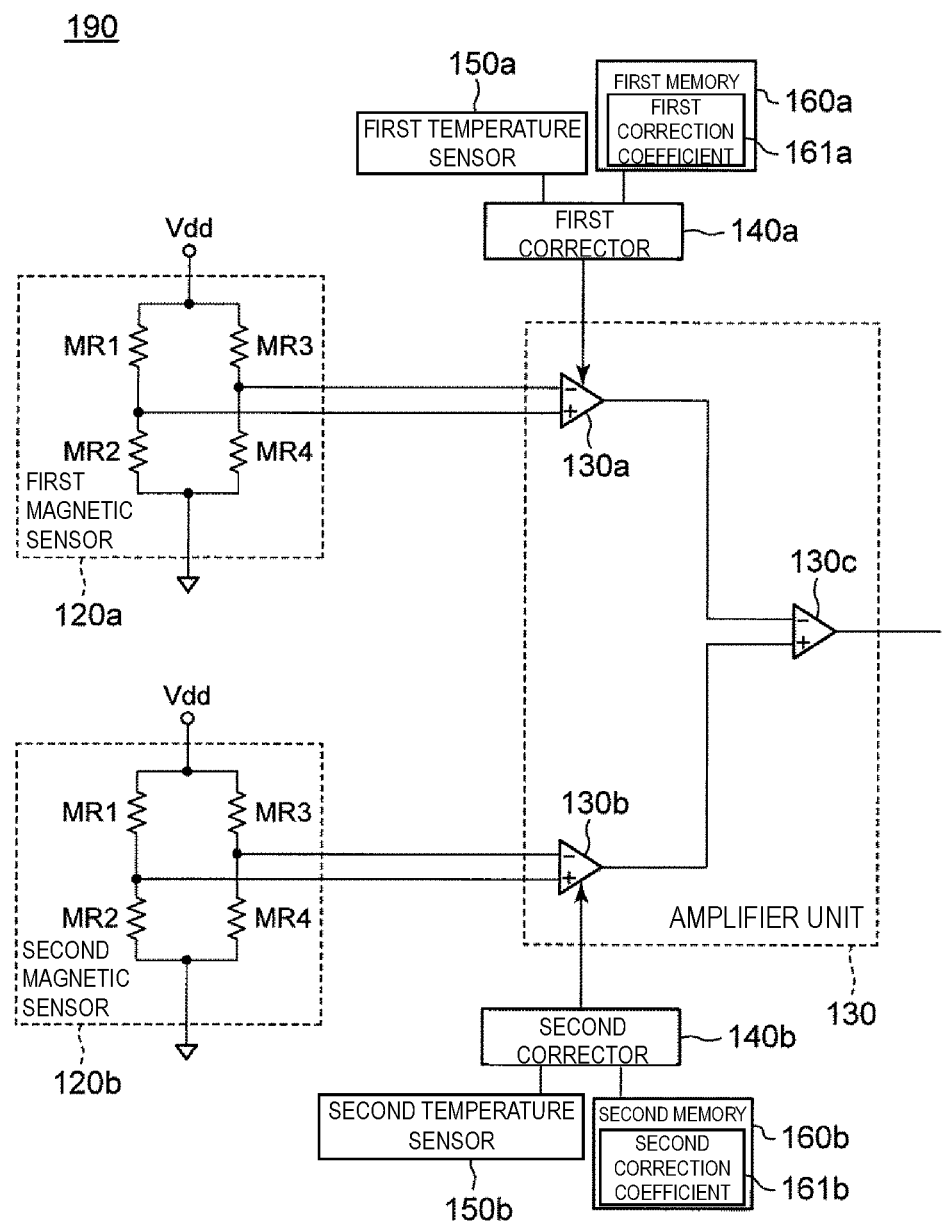
FIG. 5 is a block diagram illustrating the electrical configuration of the magnetic sensor unit shown in FIG. 3.

FIG. 1 is a perspective view illustrating the external appearance of the current sensor according to the first preferred embodiment. FIG. 2 is a perspective view illustrating the external appearance of a conductor of the current sensor shown in FIG. 1. FIG. 3 is a perspective view illustrating the external appearance of a magnetic sensor unit of the current sensor shown in FIG. 1. FIG. 4 is an exploded perspective view illustrating the configuration of the magnetic sensor unit shown in FIG. 3. FIG. 5 is a block diagram illustrating the electrical configuration of the magnetic sensor unit shown in FIG. 3. In FIGS. 1 and 2, the X-axis direction is the widthwise direction of a conductor 110, which will be discussed later, the Y-axis direction is the lengthwise direction of the conductor 110, and the Z-axis direction is the thickness direction of the conductor 110.

As shown in FIG. 1, a current sensor 100 of the first preferred embodiment includes the conductor 110 and a magnetic sensor unit 190.

As shown in FIGS. 1 and 2, the conductor 110 is a planar conductor. Fixing holes 110h for fixing and electrical connection of the current sensor 100 are provided at both end portions of the conductor 110 in the lengthwise direction (Y-axis direction).

The conductor 110 is divided into first and second flow passages 110a and 110b at one portion in the lengthwise direction (Y-axis direction) of the conductor 110. The first and second flow passages 110a and 110b are side by side in the widthwise direction (X-axis direction) of the conductor 110. A slit 110s is provided between the first and second flow passages 110a and 110b. The slit 110s is positioned at or substantially at the central portion of the conductor 110 in the widthwise direction (X-axis direction). The first flow passage 110a protrudes toward the side of one surface (+Z direction side) of the conductor 110, while the second flow passage 110b protrudes toward the side of the other surface (−Z direction side) of the conductor 110.

As shown in FIG. 2, the first flow passage 110a includes first and second protruding portions 111a and 112a and a first extending portion 113a. The first and second protruding portions 111a and 112a protrude from one surface of the conductor 110 in a direction perpendicular or substantially perpendicular to this surface. The first extending portion 113a extends in the lengthwise direction (Y-axis direction) of the conductor 110 so as to link the first and second protruding portions 111a and 112a. Similarly, the second flow passage 110b includes third and fourth protruding portions 111b and 112b and a second extending portion 113b. The third and fourth protruding portions 111b and 112b protrude from the other surface of the conductor 110 in a direction perpendicular or substantially perpendicular to this surface. The second extending portion 113b extends in the lengthwise direction (Y-axis direction) of the conductor 110 so as to link the third and fourth protruding portions 111b and 112b. With this configuration, the first and second flow passages 110a and 110b define a space. The magnetic sensor unit 190 is disposed in this space.

As the material for the conductor 110, a metal, such as copper, silver, aluminum, or iron, or an alloy made of such metals, for example, may preferably be used. The conductor 110 may be surface-treated. For example, at least one plated layer made of a metal, such as nickel, tin, silver, or copper, or an alloy made of such metals, for example, may be provided on the surface of the conductor 110. The conductor 110 may be formed by casting, cutting, or pressing, for example.

As shown in FIGS. 3 and 4, the magnetic sensor unit 190 includes a substrate 170 within a housing 180. Electronic components, such as first and second magnetic sensors 120a and 120b, are mounted on the substrate 170.

The outer shape of the housing 180 is preferably a rectangular or substantially rectangular parallelepiped, and the housing 180 includes a lower housing 181 and an upper housing 182. An outlet 182p for a wire harness to be connected to the substrate 170 is provided on the upper housing 182.

The housing 180 contacts at least a portion of the other surface of the first flow passage 110a. For example, the upper housing 182 contacts at least a portion of the other surface of the first extending portion 113a. The housing 180 also contacts at least a portion of one surface of the second flow passage 110b. For example, the lower housing 181 contacts at least a portion of one surface of the second extending portion 113b. This configuration makes it easy to set the position of the first magnetic sensor 120a with respect to the first flow passage 110a and the position of the second magnetic sensor 120b with respect to the second flow passage 110b.

The housing 180 is made of a material having electrical insulation properties. For example, the housing 180 is preferably made of engineering plastics, such as PPS (polyphenylene sulfide). PPS has high thermal resistance and is thus suitable as a material for the housing 180 in terms of heat generation in the conductor 110.

The substrate 170 is disposed within the housing 180 and is fixed thereto. The substrate 170 may be fixed to the housing 180 by screw fastening, resin heat welding, or adhesive bonding, for example. If the substrate 170 is fastened to the housing 180 using screws, the use of non-magnetic screws is preferable so as not to disturb magnetic fields.

The substrate 170 is a printed wiring board and includes a base member and wiring. The base member is preferably made of glass epoxy or alumina, for example. The wiring is preferably made of patterned metal foil, such as copper foil, for example, disposed on the surface of the base member.

Electronic components, such as the first and second magnetic sensors 120a and 120b, an amplifier unit 130, first and second correctors 140a and 140b, first and second temperature sensors 150a and 150b, and first and second memories 160a and 160b, are mounted on the substrate 170. These electronic components may be sealed within one or different resin packages or may be subjected to silicone-resin or epoxy-resin potting.

The first magnetic sensor 120a is positioned closer to the first flow passage 110a in the widthwise direction (X-axis direction). The second magnetic sensor 120b is positioned closer to the second flow passage 110b in the widthwise direction (X-axis direction). With this configuration, the first magnetic sensor 120a detects the strength of a first magnetic field generated by a current flowing through the first flow passage 110a, while the second magnetic sensor 120b detects the strength of a second magnetic field generated by a current flowing through the second flow passage 110b. That is, the first and second magnetic sensors 120a and 120b detect the strengths of magnetic fields generated by a current flowing through the conductor 110.

The above-described slit 110s provided between the first and second flow passages 110a and 110b is positioned at a middle portion between the first and second magnetic sensors 120a and 120b in the widthwise direction (X-axis direction) of the conductor 110. The width of the slit 110s may suitably be adjusted to control the strengths of magnetic fields input into these magnetic sensors.

The first temperature sensor 150a is positioned closer to the first flow passage 110a in the widthwise direction (X-axis direction). The second temperature sensor 150b is positioned closer to the second flow passage 110b in the widthwise direction (X-axis direction). With this configuration, the first temperature sensor 150a detects the ambient temperature of the first flow passage 110a and the first magnetic sensor 120a, while the second temperature sensor 150b detects the ambient temperature of the second flow passage 110b and the second magnetic sensor 120b.

The individual electronic components will be discussed below with reference to FIG. 5.

In the current sensor 100 of the present preferred embodiment, as shown in FIG. 5, the first and second magnetic sensors 120a and 120b each include a Wheatstone bridge circuit including four magneto resistance elements, such as AMR (Anisotropic Magneto Resistance) elements. That is, in each of the first and second magnetic sensors 120a and 120b, a series circuit of two magneto resistance elements MR1 and MR2 and a series circuit of two magneto resistance elements MR3 and MR4 are connected in parallel with each other. Each of the first and second magnetic sensors 120a and 120b is driven by a constant voltage, that is, a power supply voltage Vdd. The first and second magnetic sensors 120a and 120b may be driven by a constant current or pulses.

Each of the first and second magnetic sensors 120a and 120b may include a half bridge circuit including two magneto resistance elements. Additionally, instead of AMR elements, the first and second magnetic sensors 120a and 120b may each include another type of magneto resistance element, such as GMR (Giant Magneto Resistance), TMR (Tunnel Magneto Resistance), BMR (Ballistic Magneto Resistance), and CMR (Colossal Magneto Resistance) elements, for example. As the first and second magnetic sensors 120a and 120b, magnetic sensors including Hall elements, magnetic sensors including MI (Magneto Impedance) elements utilizing the magneto-impedance effect, or fluxgate magnetic sensors, for example, may be used.

The amplifier unit 130 amplifies the difference between the output voltage from the first magnetic sensor 120a and that from the second magnetic sensor 120b and outputs the amplified voltage as the output voltage from the current sensor 100. The amplifier unit 130 includes a plurality of amplifiers 130a, 130b, and 130c.

The negative input terminal of the amplifier 130a is connected to a node between the magneto resistance elements MR3 and MR4 of the first magnetic sensor 120a. The positive input terminal of the amplifier 130a is connected to a node between the magneto resistance elements MR1 and MR2 of the first magnetic sensor 120a. The amplifier 130a amplifies the output voltage from the first magnetic sensor 120a. The amplifier 130a includes a gain control terminal and changes the amplification gain under the control of the first corrector 140a.

The negative input terminal of the amplifier 130b is connected to a node between the magneto resistance elements MR3 and MR4 of the second magnetic sensor 120b. The positive input terminal of the amplifier 130b is connected to a node between the magneto resistance elements MR1 and MR2 of the second magnetic sensor 120b. The amplifier 130b amplifies the output voltage from the second magnetic sensor 120b. The amplifier 130b includes a gain control terminal and changes the amplification gain under the control of the second corrector 140a.

The negative input terminal of the amplifier 130c is connected to the output terminal of the amplifier 130a. The positive input terminal of the amplifier 130c is connected to the output terminal of the amplifier 130b. The amplifier 130c amplifies the difference between the output voltage from the amplifier 130a and that from the amplifier 130b.

As discussed above, the first temperature sensor 150a measures the ambient temperature of the first flow passage 110a and the first magnetic sensor 120a. As discussed above, the second temperature sensor 150b measures the ambient temperature of the second flow passage 110b and the second magnetic sensor 120b.

Each of the first and second memories 160a and 160b is preferably a flash memory, for example. The first memory 160a stores a reference table 161a for first correction coefficients, which will be discussed later. The second memory 160b stores a reference table 161b for second correction coefficients, which will be discussed later. The first memory 160a stores a program to provide various functions of the first corrector 140a, while the second memory 160b stores a program to provide various functions of the second corrector 140b.

Each of the first and second correctors 140a and 140b is preferably a processor, for example. The first corrector 140a executes the program stored in the first memory 160a so as to provide the various functions. The second corrector 140b executes the program stored in the second memory 160b so as to provide the various functions. Each of the first and second correctors 140a and 140b may preferably be defined by a hardware circuit, such as an application specific integrated circuit (ASIC) or a field programmable gate array (FPGA), for example. The functions of the first and second correctors 140a and 140b may be provided by a combination of hardware and software or only by hardware (electronic circuit). The first and second correctors 140a and 140b each include an ADC (Analog to Digital Converter) and a DAC (Digital to Analog Converter).

The first corrector 140a refers to the first reference table 161a for the first correction coefficients stored in the first memory 160a so as to determine the first correction coefficient associated with the ambient temperature detected by the first temperature sensor 150a. The first corrector 140a changes the amplification gain of the amplifier 130a of the amplifier unit 130, based on the determined first correction coefficient. In this case, the first corrector 140a converts an analog signal received from the first temperature sensor 150a into a digital signal by using the ADC, performs digital processing, and then converts a digital signal indicating the first correction coefficient into an analog signal by using the DAC.

The second corrector 140b refers to the second reference table 161b for the second correction coefficients stored in the second memory 160b so as to determine the second correction coefficient associated with the ambient temperature detected by the second temperature sensor 150b. The second corrector 140b changes the amplification gain of the amplifier 130b of the amplifier unit 130, based on the determined second correction coefficient. In this case, the second corrector 140b converts an analog signal received from the second temperature sensor 150b into a digital signal by using the ADC, performs digital processing, and then converts a digital signal indicating the second correction coefficient into an analog signal by using the DAC.

The first corrector 140a, the first temperature sensor 150a, and the first memory 160a may preferably be defined by a programmable signal conditioner. The second corrector 140b, the second temperature sensor 150b, and the second memory 160b may preferably be defined by a programmable signal conditioner.

The operation of the current sensor 100 described above will be described below.

Figure 6:
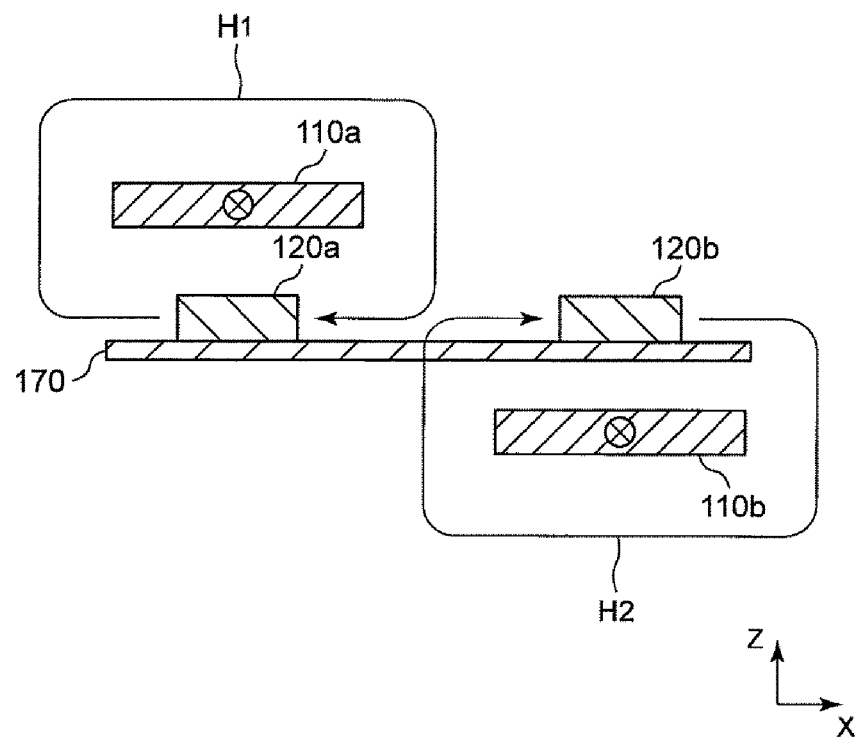
FIG. 6 is a sectional view of the current sensor shown in FIG. 1, as viewed from the direction indicated by the arrow of line VI-VI in FIG. 1.

FIG. 6 is a sectional view of the current sensor according to the first preferred embodiment, as viewed from the direction indicated by the arrow of line VI-VI in FIG. 1. In FIG. 6, the housing 180 is not shown.

A current to be measured flows in the lengthwise direction (Y-axis direction) of the conductor 110, and is then split between the first and second flow passages 110a and 110b at the dividing portion of these flow passages. That is, a portion of the current flows through the first flow passage 110a, and the remaining current flows through the second flow passage 110b.

As shown in FIG. 6, a first magnetic field H1 is generated around the first flow passage 110a by the current flowing through the first flow passage 110a. A second magnetic field H2 is generated around the second flow passage 110b by the current flowing through the second flow passage 110b. The first magnetic field H1 and the second magnetic field H2 are superimposed on each other and are distributed in a space around the conductor 110. The first magnetic sensor 120a mainly detects the strength of the first magnetic field H1 because it is located closer to the first flow passage 110a than to the second flow passage 110b, and outputs a voltage corresponding to the strength of the first magnetic field H1. The second magnetic sensor 120b mainly detects the strength of the second magnetic field H2 because it is located closer to the second flow passage 110b than to the first flow passage 110a, and outputs a voltage corresponding to the strength of the second magnetic field H2.

Then, as shown in FIG. 5, the amplifier unit 130 amplifies the difference between the output voltage from the first magnetic sensor 120a and that from the second magnetic sensor 120b. As a result, the current sensor 100 outputs the voltage corresponding to the magnitude of a current flowing through the conductor 110.

Problems to be solved by preferred embodiments of the present invention will be discussed below with reference to FIGS. 7A through 7D and 8A through 8D.

Figure 7A:
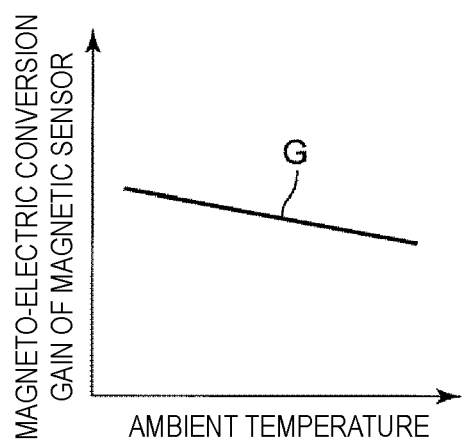
FIG. 7A is a graph illustrating the temperature characteristics of the magneto-electric conversion gain of a magnetic sensor.

FIG. 7A is a graph illustrating the temperature characteristics of the magneto-electric conversion gain of a magnetic sensor. As shown in FIG. 7A, typically, a magnetic sensor has the temperature dependence of the magneto-electric conversion gain G. More specifically, the magneto-electric conversion gain G of a magnetic sensor is decreased as the ambient temperature rises. Accordingly, a current sensor including a magnetic sensor exhibits output errors due to a change in the ambient temperature. To address this issue, based on the ambient temperature, the current sensor of the related art disclosed in Japanese Unexamined Patent Application Publication No. 2007-278938 corrects output errors caused by the temperature dependence of the magnetic senor.

Figure 7B:
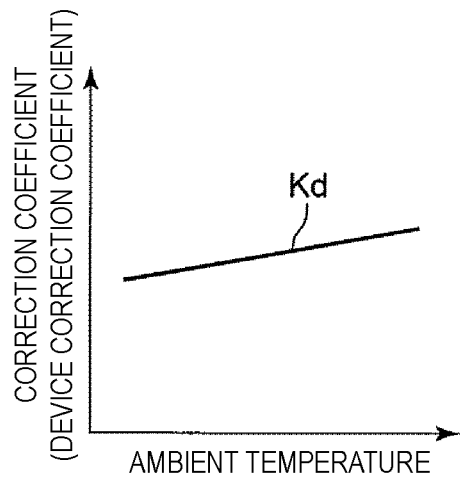
FIG. 7B is a graph illustrating the temperature characteristics of an existing correction coefficient used in a known current sensor.
Figure 7C:
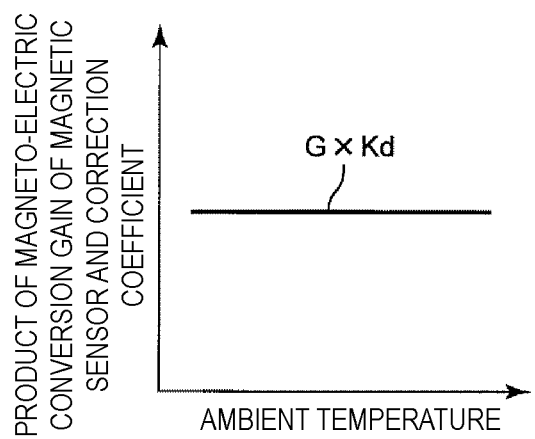
FIG. 7C is a graph illustrating the temperature characteristics of the product of the magneto-electric conversion gain of the magnetic sensor and the existing correction coefficient.
Figure 7D:
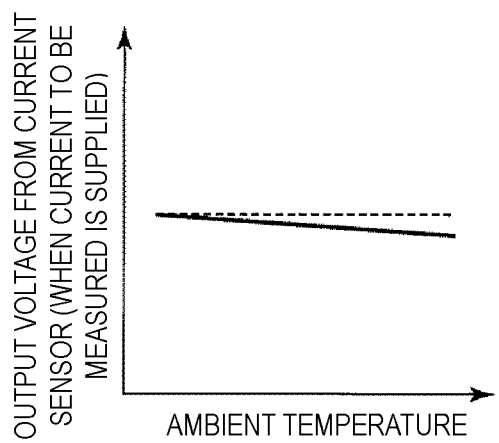
FIG. 7D is a graph illustrating the temperature characteristics of the output voltage from the known current sensor.

FIG. 7B is a graph illustrating the temperature characteristics of an existing correction coefficient used in a known current sensor. FIG. 7C is a graph illustrating the temperature characteristics of the product of the magneto-electric conversion gain of the magnetic sensor and the existing correction coefficient. FIG. 7D is a graph illustrating the temperature characteristics of the output voltage from the known current sensor.

As shown in FIG. 7B, as correction coefficients, the known current sensor stores device correction coefficients Kd to cancel fluctuations in the magneto-electric conversion gain G of the magnetic sensor caused by a temperature change. The known current sensor then corrects fluctuations in the magneto-electric conversion gain G of the magnetic sensor caused by a temperature change using the correction coefficient Kd associated with the ambient temperature. In the known current sensor, as shown in FIG. 7C, a temperature change of the product of the magneto-electric conversion gain G of the magnetic sensor and the correction coefficient Kd is able to be made uniform. As a result, the temperature change of the output voltage from the current sensor is able to be made uniform.

However, the inventors of preferred embodiments of the present invention have discovered that, even though a temperature change of the product of the magneto-electric conversion gain G of the magnetic sensor and the correction coefficient Kd is made uniform, a temperature change of the output voltage from the current sensor does not become uniform, which would have been indicated by the broken line, and instead, the output voltage from the current sensor is decreased as the ambient temperature rises, as indicated by the solid line, as shown in FIG. 7D. The inventors of preferred embodiments of the present invention have analyzed the reasons for this as follows.

Figure 8A:
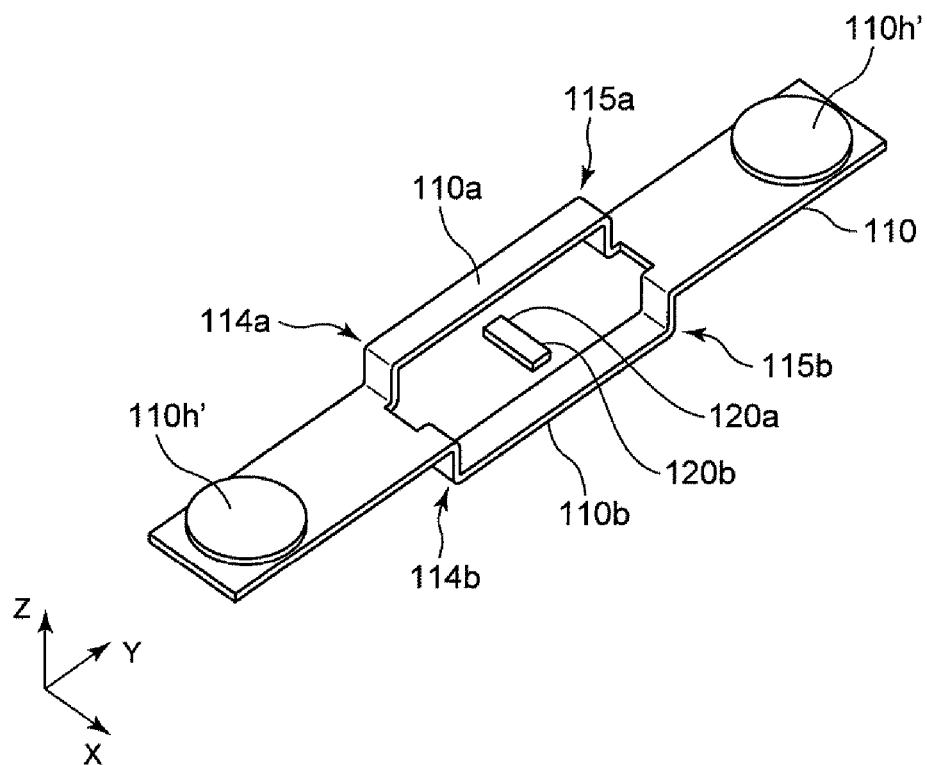
FIG. 8A illustrates a current sensor model for analyzing a stress applied to first and second flow passages of a conductor of a current sensor.
Figure 8B:
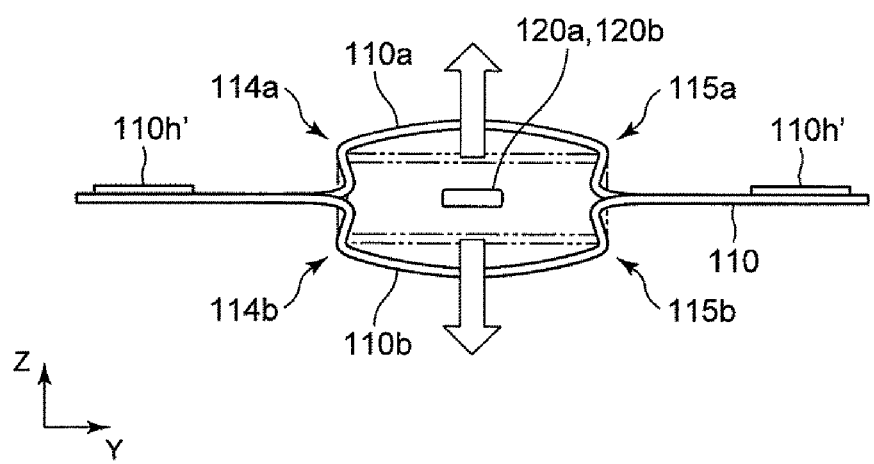
FIG. 8B is a view for explaining the results of analyzing a stress applied to the current sensor shown in FIG. 8A.

FIG. 8A illustrates a current sensor model for analyzing a stress applied to the first and second flow passages 110a and 110b of the conductor 110 of the current sensor 100. FIG. 8B is a view for explaining the result of analyzing a stress applied to the current sensor shown in FIG. 8A, as viewed from the widthwise direction (X-axis direction) of the conductor 110.

In FIGS. 8A and 8B, the length (Y-axis direction) of the conductor 110 is about 110 mm, the width (X-axis direction) of the conductor 110 is about 15.5 mm, and the thickness (Z-axis direction) of the conductor 110 is about 1.2 mm. The length (Y-axis direction) of each of the first and second flow passages 110a and 110b is about 40.0 mm, and the width (X-axis direction) of each of the first and second flow passages 110a and 110b is about 5.0 mm. The width (X-axis direction) of the slit 110s provided between the first and second flow passages 110a and 110b is about 5.5 mm. The first flow passage 110a is projected in the thickness direction (Z-axis direction) of the conductor 110 by about 6.2 mm, while the second flow passage 110b is projected in the thickness direction (Z-axis direction) of the conductor 110 by about −6.2 mm. With this configuration, the height of a space defined by the first and second flow passages 110a and 110b in the thickness direction (Z-axis direction) of the conductor 110 is about 10.0 mm, and the dimension of this space in the lengthwise direction (Y-axis direction) of the conductor 110 is about 35.0 mm.

In the current sensor model shown in FIG. 8A, fixing portions 110h' are provided instead of the fixing holes 110h of the current sensor 100 shown in FIG. 1. In FIGS. 8A and 8B, a bending portion 114a corresponds to a portion bending between the first protruding portion 111a and the first extending portion 113a in the current sensor 100 (FIG. 2), and a bending portion 115a corresponds to a portion bending between the second protruding portion 112a and the first extending portion 113a. A bending portion 114b corresponds to a portion bending between the third protruding portion 111b and the second extending portion 113b, and a bending portion 115b corresponds to a portion bending between the fourth protruding portion 112b and the second extending portion 113b.

In this analysis, the deformation of the conductor 110 caused by a stress applied to the conductor 110 in a state in which the end portions of the conductor 110 were fixed at the fixing portions 110h' was analyzed. The ambient temperature was maintained at about 25 degrees, and a current of about 129 amperes was continuously supplied to the conductor 110. Heat was dissipated from the conductor 110 only by natural convection.

Usually, when a stress is applied to a conductor including a bending portion, the conductor is likely to deform at the bending portion. In FIGS. 8A and 8B, the first flow passage 110a between the bending portions 114a and 115a and the second flow passage 110b between the bending portions 114b and 115b are deformed. The reason for this is as follows. The conductor 110 expands due to the generation of heat because of a continuous current supply, and then, a stress is produced between the fixing portions 110h'. According to the analyzing simulations using the model shown in FIG. 8A, the first flow passage 110a is deformed at a maximum of about 106.301 μm in the thickness direction (Z-axis direction) of the conductor 110, and the second flow passage 110b is deformed at a maximum of about 96.352 μm in the thickness direction (Z-axis direction) of the conductor 110.

Figure 8C:
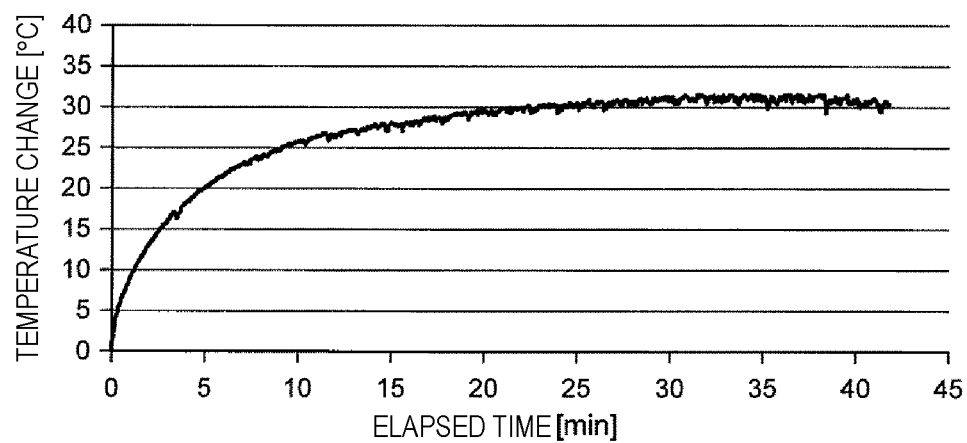
FIG. 8C is a graph illustrating the results of measuring a temperature increase of a conductor due to a current supply.
Figure 8D:
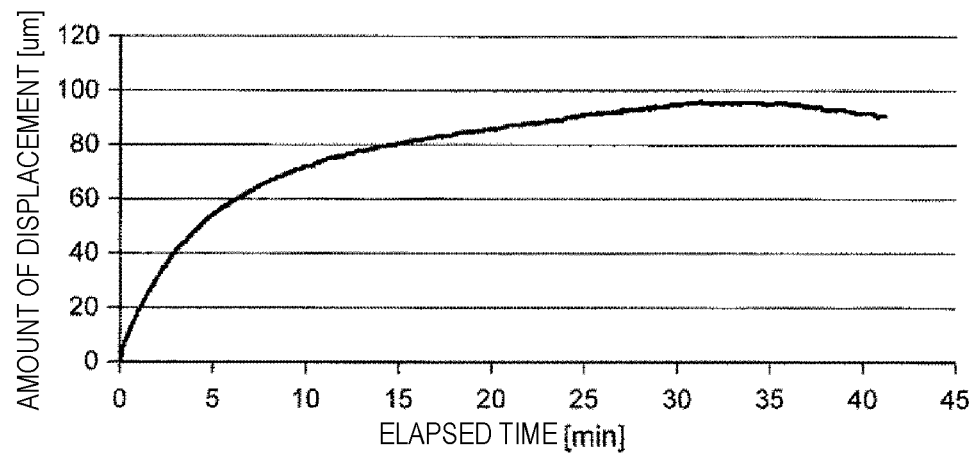
FIG. 8D is a graph illustrating the results of measuring a change in the amount of displacement of the same conductor over time.

FIG. 8C is a graph illustrating the result of measuring a temperature change of the conductor due to a current supply over time. FIG. 8D is a graph illustrating the results of measuring a change in the amount of displacement of the same conductor over time. In the measurements, a current of about 128 amperes was continuously supplied to the conductor 110 used in the analysis shown in FIGS. 8A and 8B. To measure the temperature of the conductor, a thermocouple attached to the conductor was used. To measure the amount of displacement of the conductor, a laser displacement meter (LK-G32 made by Keyence Corporation) was used.

FIGS. 8C and 8D show that, as the temperature of the first and second flow passages 110a and 110b of the conductor 110 logarithmically increases, in other words, as the ambient temperature rises, the amount of displacement of the first and second flow passages 110a and 110b increases.

As seen from the stress analyzing results obtained as shown FIGS. 8A and 8B and the measurement results shown in FIGS. 8C and 8D, as the ambient temperature rises, the first flow passage 110a is deformed to increase the distance from the first magnetic sensor 120a, and the second flow passage 110b is deformed to increase the distance from the second magnetic sensor 120b. As a result of the first magnetic sensor 120a being deformed in this manner, although the strength of the first magnetic field generated by a current flowing through the first flow passage 110a does not change, the strength of the first magnetic field detected by the first magnetic sensor 120a becomes smaller, and the output voltage from the first magnetic sensor 120a accordingly becomes smaller. As a result of the second magnetic sensor 120b being deformed in this manner, although the strength of the second magnetic field generated by a current flowing through the second flow passage 110b does not change, the strength of the second magnetic field detected by the second magnetic sensor 120b becomes smaller, and the output voltage from the second magnetic sensor 120b accordingly becomes smaller. As a result, the output voltage from the current sensor 100 is decreased.

In this manner, the inventors of preferred embodiments of the present invention have discovered that, in response to an ambient temperature change, each of the first and second flow passages 110a and 110b of the conductor 110 is deformed, which changes the strength of the magnetic field detected by each of the first and second magnetic sensors 120a and 120b, and the output voltages from the first and second magnetic sensors 120a and 120b are accordingly changed. Output errors of the current sensor 100 are produced in this manner.

In the present specification, in addition to fluctuations in the magneto-electric conversion gain G of each of the first and second magnetic sensors 120a and 120b caused by a temperature change, fluctuations in the output voltage from each of the first and second magnetic sensors 120a and 120b caused by the deformation of the first and second flow passages 110a and 110b due to a temperature change (ambient temperature change and heat generation due to a current supply) are also corrected.

A description will now be provided of the first reference table 161a of the first correction coefficients stored in the first memory 160a and the second reference table 161b of the second correction coefficients stored in the second memory 160b.

Figure 9A:
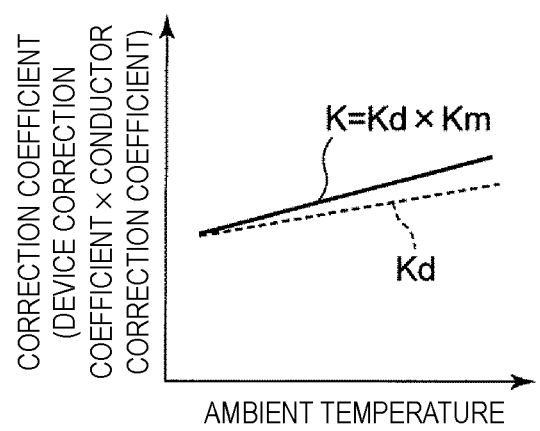
FIG. 9A is a graph illustrating the qualitative temperature characteristics of first and second correction coefficients used in the current sensor of the first preferred embodiment of the present invention.
Figure 9B:
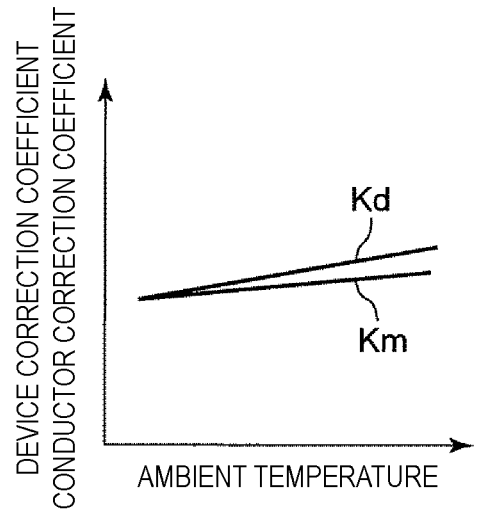
FIG. 9B is a graph illustrating the qualitative temperature characteristics of a first device correction coefficient and a first conductor correction coefficient defining the first correction coefficient shown in FIG. 9A and a second device correction coefficient and a second conductor correction coefficient defining the second correction coefficient shown in FIG. 9A.
Figure 9C:
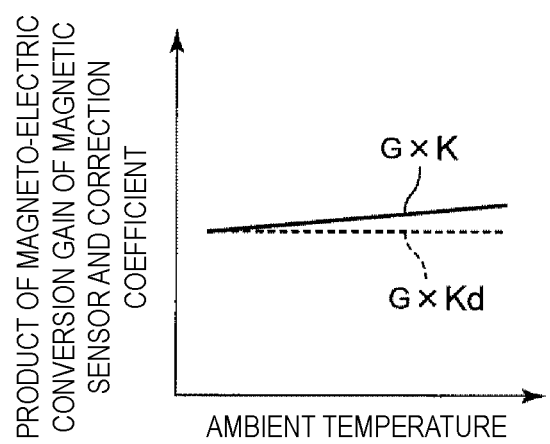
FIG. 9C is a graph illustrating the qualitative temperature characteristics of the product of the magneto-electric conversion gain of a first magnetic sensor and the first correction coefficient of the first preferred embodiment and the product of the magneto-electric conversion gain of a second magnetic sensor and the second correction coefficient of the first preferred embodiment of the present invention.
Figure 9D:
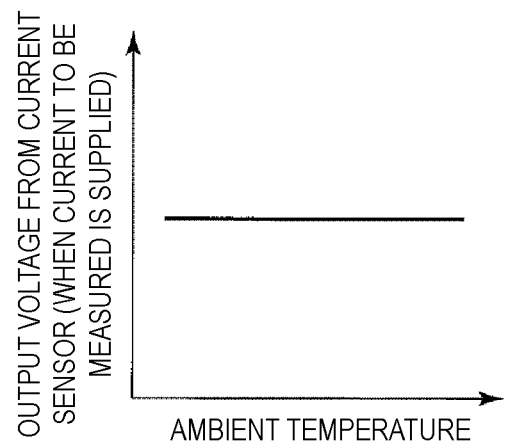
FIG. 9D is a graph illustrating the qualitative temperature characteristics of the output voltage from the current sensor of the first preferred embodiment of the present invention.

FIG. 9A is a graph illustrating the qualitative temperature characteristics of first and second correction coefficients used in the current sensor of the first preferred embodiment. FIG. 9B is a graph illustrating the qualitative temperature characteristics of a first device correction coefficient and a first conductor correction coefficient defining the first correction coefficient shown in FIG. 9A and a second device correction coefficient and a second conductor correction coefficient defining the second correction coefficient shown in FIG. 9A. FIG. 9C is a graph illustrating the qualitative temperature characteristics of the product of the magneto-electric conversion gain of the first magnetic sensor and the first correction coefficient of the first preferred embodiment and the product of the magneto-electric conversion gain of the second magnetic sensor and the second correction coefficient of the first preferred embodiment. FIG. 9D is a graph illustrating the qualitative temperature characteristics of the output voltage from the current sensor of the first preferred embodiment.

In the present preferred embodiment, the first memory 160a stores a plurality of first correction coefficients K as the first reference table 161a in association with the individual ambient temperatures (FIG. 9A). The first correction coefficient K is calculated by multiplying a first device correction coefficient Kd (FIG. 9B) by a first conductor correction coefficient Km (FIG. 9B). The first device correction coefficient Kd is used to correct fluctuations in the magneto-electric conversion gain G (FIG. 7A) of the first magnetic sensor 120a caused by an ambient temperature change. The first conductor correction coefficient Km is used to correct fluctuations in the output voltage from the first magnetic sensor 120a caused by the deformation of the first flow passage 110a due to an ambient temperature change. As the temperature rises, the first flow passage 110a is deformed to increase the distance from the first magnetic sensor 120a, and the output voltage from the first magnetic sensor 120a is accordingly decreased. To correct a decrease in the output voltage, the first conductor correction coefficient Km is set to increase as the temperature increases, as shown in FIG. 9B. With this setting, as shown in FIG. 9A, with respect to a temperature rise, the first correction coefficient K increases by a greater amount than the first device correction coefficient Kd (indicated by the broken line).

Similarly, the second memory 160b stores a plurality of second correction coefficients K as the second reference table 161b in association with the individual ambient temperatures (FIG. 9A). The second correction coefficient K is calculated by multiplying a second device correction coefficient Kd (FIG. 9B) by a second conductor correction coefficient Km (FIG. 9B). The second device correction coefficient Kd is used to correct fluctuations in the magneto-electric conversion gain G (FIG. 7A) of the second magnetic sensor 120b caused by an ambient temperature change. The second conductor correction coefficient Km is used to correct fluctuations in the output voltage from the second magnetic sensor 120b caused by the deformation of the second flow passage 110b due to an ambient temperature change. As the temperature rises, the second flow passage 110b is deformed to increase the distance from the second magnetic sensor 120b, and the output voltage from the second magnetic sensor 120b is accordingly decreased. To correct a decrease in the output voltage, the second conductor correction coefficient Km is set to become larger as the temperature rises, as shown in FIG. 9B. With this setting, as shown in FIG. 9A, with respect to a temperature rise, the second correction coefficient K increases by a greater amount than the second device correction coefficient Kd (indicated by the broken line).

In the present preferred embodiment, the product of the magneto-electric conversion gain G of the first magnetic sensor 120a and the first correction coefficient K (Kd×Km) is set to become larger with respect to a temperature rise (FIG. 9C). The product (indicated by the broken line) of the magneto-electric conversion gain G of the first magnetic sensor 120a and the first device correction coefficient Kd is constant with respect to a temperature rise. The product of the magneto-electric conversion gain G of the second magnetic sensor 120b and the second correction coefficient K (Kd×Km) is set to become larger with respect to a temperature rise (FIG. 9C). The product (indicated by the broken line) of the magneto-electric conversion gain G of the second magnetic sensor 120b and the second device correction coefficient Kd is constant with respect to a temperature rise. With this configuration, when a current does not flow through the conductor 110, the output voltage from the current sensor 100 becomes larger as the temperature rises.

With the above-described configuration, fluctuations in the output voltage from the current sensor 100 due to a temperature change when a current to be measured flows through the conductor 110 are able to be made uniform (FIG. 9D).

Setting of the first correction coefficient K (first device correction coefficient Kd×first conductor correction coefficient Km) and the second correction coefficient K (second device correction coefficient Kd×second conductor correction coefficient Km) in the present preferred embodiment will be discussed below.

For example, a magnetic field is applied to the first magnetic sensor 120a by a magnetic-field generator, such as a Helmholtz coil, while the ambient temperature is changed using a temperature test chamber, and the input-output characteristics of the first magnetic sensor 120a are measured. The temperature characteristics of the magneto-electric conversion gain G of the first magnetic sensor 120a are measured (FIG. 7A). Then, the first device correction coefficient Kd to cancel fluctuations in the magneto-electric conversion gain G of the first magnetic sensor 120a caused by a temperature change is determined (FIG. 9B). The first device correction coefficient Kd may be determined so that the magneto-electric conversion gain G of the first magnetic sensor 120a caused by a temperature change will become uniform. Alternatively, the first device correction coefficient Kd may be determined so that fluctuations in the magneto-electric conversion gain G of the first magnetic sensor 120a caused by a temperature change is able to be reduced and contained within a predetermined range.

Similarly, the temperature characteristics with respect to the magneto-electric conversion gain G of the second magnetic sensor 120b may also be measured. Then, the second device correction coefficient Kd to cancel fluctuations in the magneto-electric conversion gain G of the second magnetic sensor 120b caused by a temperature change may also be determined. That is, fluctuations in the magneto-electric conversion gain G of the first magnetic sensor 120a and those of the second magnetic sensor 120b due to a temperature change may be separately measured, and the first device correction coefficient Kd and the second device correction coefficient Kd may be separately set. In this manner, by individually measuring and identifying the characteristics of the first magnetic sensor 120a and those of the second magnetic sensor 120b, variations in each of the magnetic sensors are able to be reflected in the correction coefficient. It is thus possible to provide a higher-precision current sensor.

Alternatively, fluctuations in the magneto-electric conversion gain G of only one of the first and second magnetic sensors 120a and 120b caused by a temperature change may be measured, and the same device correction coefficient may be set for the first and second device correction coefficients Kd. For example, it is assumed that the first and second magnetic sensors 120a and 120b are fabricated in the same lot and variations in the temperature characteristics of the magneto-electric conversion gain G between the first and second magnetic sensors 120a and 120b are small. In this case, the device correction coefficient Kd determined based on the temperature characteristics of the magneto-electric conversion gain of only one of the first and second magnetic sensors 120a and 120b may be used for both of the first and second device correction coefficients Kd.

As the number of temperatures to be used for measurements, two or more temperatures are sufficient. The number of temperatures to be used for measurements is suitably determined in accordance with the tendency of the temperature characteristics of the magnetic sensors. If the temperature characteristics linearly change, the two temperatures may be used for approximately determining the values of the magneto-electric conversion gain with respect to the other temperatures. If the temperature characteristics nonlinearly change, more temperatures are used for measurements to improve the correction precision.

The mounting state of the magnetic sensors at the time of measurements is not restricted to a particular state. For example, magnetic sensors may be used alone, or magnetic sensors mounted on a printed substrate may be used. Alternatively, magnetic sensors in a current sensor may be used. By measuring and identifying the characteristics of magnetic sensors in the mounting state, variations in the characteristics of the mounted magnetic sensors are also able to be reflected in the correction coefficients. It is thus possible to provide a higher-precision current sensor.

Under the constant temperature environments, a current is caused to flow through the conductor 110, and the ambient temperature change due to heat generation in the first flow passage 110a of the conductor 110 and the amount of deformation of the first flow passage 110a are measured (FIGS. 8C and 8D). From the amount of deformation of the first flow passage 110a, the amount of change in the strength of the first magnetic field at the first magnetic sensor 120*a* with respect to the value of a current to be measured is calculated, thus estimating the output voltage of the first magnetic sensor 120*a*. Then, the first conductor correction coefficient Km to cancel fluctuations in the output voltage from the first magnetic sensor 120*a* caused by a temperature change is determined (FIG. 9B). The first conductor correction coefficient Km may be determined so that the output voltage from the first magnetic sensor 120*a* due to a temperature change will become uniform. Alternatively, the first conductor correction coefficient Km may be determined so that fluctuations in the output voltage from the first magnetic sensor 120*a* caused by a temperature change are able to be reduced and contained within a predetermined range.

In the constant temperature environments, a current is caused to flow through the conductor 110, and the ambient temperature change due to heat generation in the first flow passage 110*a* of the conductor 110 and fluctuations in the output voltage from the first magnetic sensor 120*a* caused by the deformation of the first flow passage 110*a* of the conductor 110 may be measured.

Similarly, a current may be caused to flow through the conductor 110, and the ambient temperature change due to heat generation in the second flow passage 110*b* and the amount of deformation of the second flow passage 110*b* may be measured, thus estimating the output voltage of the second magnetic sensor 120*b*. Then, the second conductor correction coefficient Km to cancel fluctuations in the output voltage from the second magnetic sensor 120*b* caused by a temperature change may be determined. That is, by separately measuring fluctuations in the output voltage from the first magnetic sensor 120*a* caused by the deformation of the first flow passage 110*a* due to a temperature change and those in the output voltage from the second magnetic sensor 120*b* caused by the deformation of the second flow passage 110*b* due to a temperature change, the first conductor correction coefficient Km and the second conductor correction coefficient Km are able to be separately set.

Fluctuations in the output voltage from only one of the first and second magnetic sensors 120*a* and 120*b* caused by the deformation of the corresponding one of the first and second flow passages 110*a* and 110*b* due to a temperature change may be measured, and the same conductor correction coefficient may be set for the first and second conductor correction coefficients Km. For example, if the manufacturing variations between the first and second flow passages 110*a* and 110*b* are small, the conductor correction coefficient Km determined based on the temperature characteristics concerning the output voltage from one of the magnetic sensors may be used for both of the first and second device correction coefficients Kd.

Then, by multiplying the first device correction coefficient Kd by the first conductor correction coefficient Km for each of the temperatures used for measurements, the first correction coefficient K is determined (FIG. 9A). By multiplying the second device correction coefficient Kd by the second conductor correction coefficient Km for each of the temperatures used for measurements, the second correction coefficient K is determined (FIG. 9A).

Then, the determined plurality of first correction coefficients K are stored as the first reference table 161*a* in the first memory 160*a* in association with the individual ambient temperatures. The determined plurality of second correction coefficients K are stored as the second reference table 161*b* in the second memory 160*b* in association with the individual ambient temperatures.

In the present preferred embodiment, various modifications may be made to the first and second correction coefficients, depending on how the first and second flow passages 110*a* and 110*b* are deformed and the fluctuation characteristics of the magneto-electric conversion gains of the first and second magnetic sensors 120*a* and 120*b*.

In the above-described first preferred embodiment, as the ambient temperature rises, the first flow passage 110*a* is deformed to increase the distance from the first magnetic sensor 120*a*, and the second flow passage 110*b* is deformed to increase the distance from the second magnetic sensor 120*b*. However, the first and second flow passages 110*a* and 110*b* may be deformed in a different manner from the first preferred embodiment depending on their shape and configuration.

In a first modified example, a description will be provided of a case in which, as the ambient temperature rises, the first flow passage 110*a* is deformed to decrease the distance from the first magnetic sensor 120*a*, and the second flow passage 110*b* is deformed to decrease the distance from the second magnetic sensor 120*b*. As a result of the first magnetic sensor 120*a* being deformed in this manner, although the strength of the first magnetic field generated by a current flowing through the first flow passage 110*a* does not change, the strength of the first magnetic field detected by the first magnetic sensor 120*a* becomes greater, and the output voltage from the first magnetic sensor 120*a* accordingly becomes greater. As a result of the second magnetic sensor 120*b* being deformed in this manner, although the strength of the second magnetic field generated by a current flowing through the second flow passage 110*b* does not change, the strength of the second magnetic field detected by the second magnetic sensor 120*b* becomes greater, and the output voltage from the second magnetic sensor 120*b* accordingly becomes greater. As a result, the output voltage from the current sensor 100 is increased.

Figure 10A:
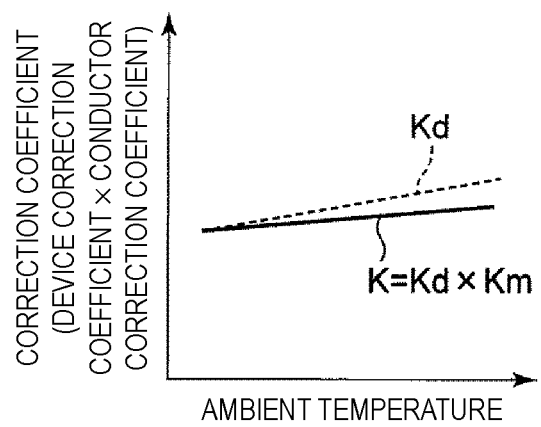
FIG. 10A is a graph illustrating the qualitative temperature characteristics of first and second correction coefficients used in a first modified example.
Figure 10B:
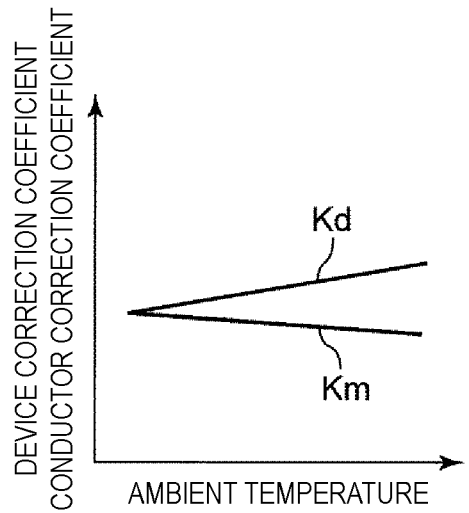
FIG. 10B is a graph illustrating the qualitative temperature characteristics of a first device correction coefficient and a first conductor correction coefficient defining in the first correction coefficient shown in FIG. 10A and a second device correction coefficient and a second conductor correction coefficient defining the second correction coefficient shown in FIG. 10A.
Figure 10C:
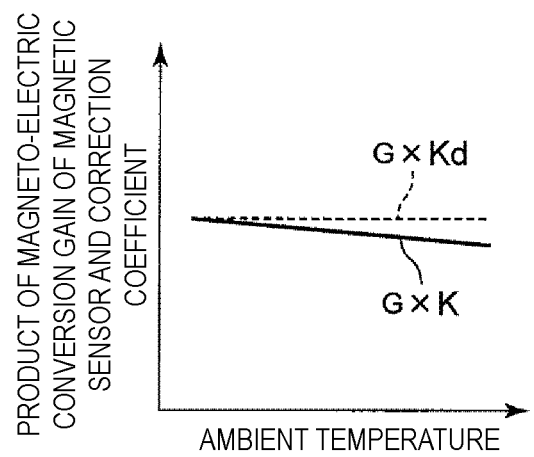
FIG. 10C is a graph illustrating the qualitative temperature characteristics of the product of the magneto-electric conversion gain of a first magnetic sensor and the first correction coefficient of the first modified example and the product of the magneto-electric conversion gain of a second magnetic sensor and the second correction coefficient of the first modified example.
Figure 10D:
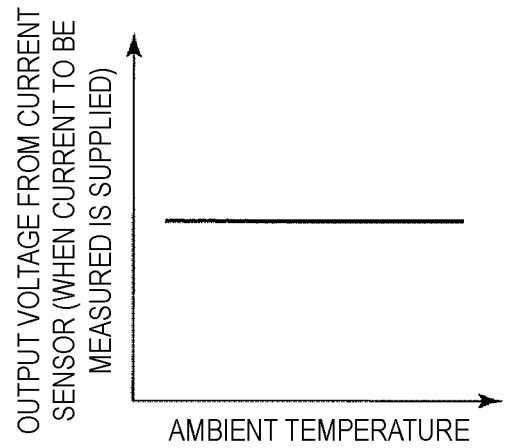
FIG. 10D is a graph illustrating the qualitative temperature characteristics of the output voltage from a current sensor of the first modified example.

FIG. 10A is a graph illustrating the qualitative temperature characteristics of first and second correction coefficients used in the first modified example. FIG. 10B is a graph illustrating the qualitative temperature characteristics of a first device correction coefficient and a first conductor correction coefficient defining the first correction coefficient shown in FIG. 10A and a second device correction coefficient and a second conductor correction coefficient defining the second correction coefficient shown in FIG. 10A. FIG. 10C is a graph illustrating the qualitative temperature characteristics of the product of the magneto-electric conversion gain of the first magnetic sensor and the first correction coefficient of the first modified example and the product of the magneto-electric conversion gain of the second magnetic sensor and the second correction coefficient of the first modified example. FIG. 10D is a graph illustrating the qualitative temperature characteristics of the output voltage from the current sensor of the first modified example.

In the first modified example, the first memory 160*a* stores a plurality of first correction coefficients K as the first reference table 161*a* in association with the individual ambient temperatures (FIG. 10A). The first correction coefficient K of the first modified example is calculated by multiplying a first device correction coefficient Kd (FIG. 10B) similar to that of the first preferred embodiment by a first conductor correction coefficient Km of the first modified example (FIG. 10B). When the first flow passage 110*a* is deformed to decrease the distance from the first magnetic sensor 120*a* in accordance with a temperature rise, the output voltage from the first magnetic sensor 120*a* is increased. To correct an increase in the output voltage, the first conductor correction coefficient Km of the first modified example is set to become smaller as the temperature rises, as shown in FIG. 10B. With this setting, as shown in FIG. 10A, with respect to a temperature rise, the first correction coefficient K of the first modified example increases by a smaller amount than the first device correction coefficient Kd (indicated by the broken line).

Similarly, the second memory 160b stores a plurality of second correction coefficients K as the second reference table 161b in association with the individual ambient temperatures (FIG. 10A). The second correction coefficient K of the first modified example is calculated by multiplying a second device correction coefficient Kd (FIG. 10B) similar to that of the first preferred embodiment by a second conductor correction coefficient Km of the first modified example (FIG. 10B). When the second flow passage 110b is deformed to decrease the distance from the second magnetic sensor 120b in accordance with a temperature rise, the output voltage from the second magnetic sensor 120b is increased. To correct an increase in the output voltage, the second conductor correction coefficient Km of the first modified example is set to become smaller as the temperature rises, as shown in FIG. 10B. With this setting, as shown in FIG. 10A, with respect to a temperature rise, the second correction coefficient K of the first modified example increases by a smaller amount than the second device correction coefficient Kd (indicated by the broken line).

In the first modified example, the product of the magneto-electric conversion gain G of the first magnetic sensor 120a and the first correction coefficient K (Kd×Km) is set to become smaller with respect to a temperature rise (FIG. 10C). The product of the magneto-electric conversion gain G of the second magnetic sensor 120b and the second correction coefficient K (Kd×m) is set to become smaller with respect to a temperature rise (FIG. 10C). With this configuration, when a current does not flow through the conductor 110, the output voltage from the current sensor 100 becomes smaller as the temperature rises.

With the above-described configuration, fluctuations in the output voltage from the current sensor 100 due to a temperature change when a current to be measured flows through the conductor 110 are able to be made uniform (FIG. 10D).

In the above-described first preferred embodiment, because of the deformation of the first flow passage 110a due to a temperature change, the output voltage from the first magnetic sensor 120a linearly changes with respect to a temperature rise. Because of the deformation of the second flow passage 110b due to a temperature change, the output voltage from the second magnetic sensor 120b linearly changes with respect to a temperature rise. However, the output voltage from each of the first and second magnetic sensors 120a and 120b may not necessarily change linearly with respect to a temperature rise.

In a second modified example, a description will be provided of a case in which, because of the deformation of the first flow passage 120a due to a temperature change, the output voltage from the first magnetic sensor 120a nonlinearly changes with respect to a temperature rise, and because of the deformation of the second flow passage 120b due to a temperature change, the output voltage from the second magnetic sensor 120b nonlinearly changes with respect to a temperature rise.

Figure 11A:
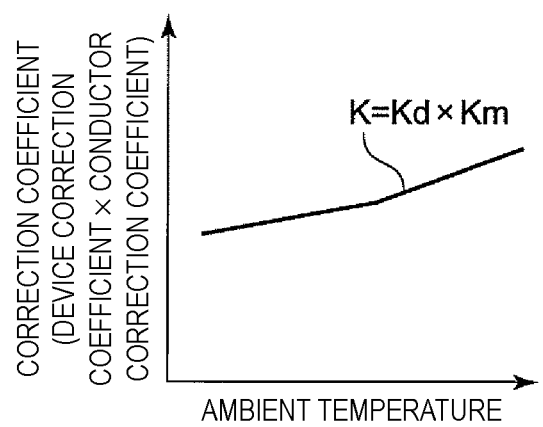
FIG. 11A is a graph illustrating the qualitative temperature characteristics of first and second correction coefficients used in a second modified example.
Figure 11B:
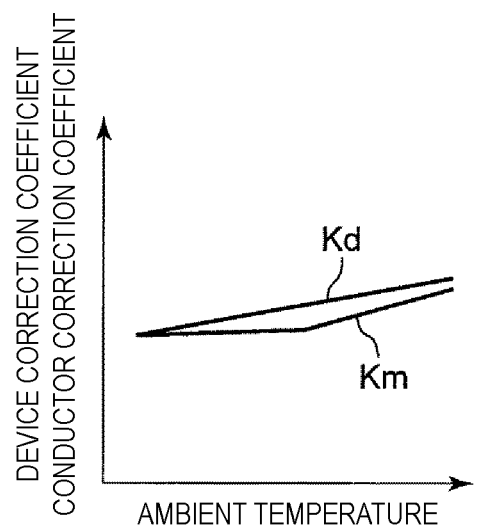
FIG. 11B is a graph illustrating the qualitative temperature characteristics of a first device correction coefficient and a first conductor correction coefficient defining the first correction coefficient shown in FIG. 11A and a second device correction coefficient and a second conductor correction coefficient defining the second correction coefficient shown in FIG. 11A.
Figure 11C:
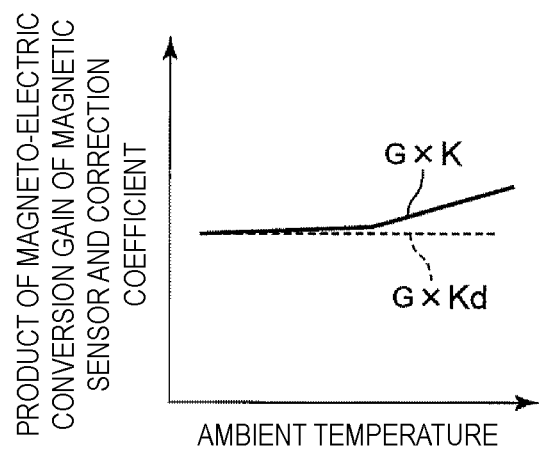
FIG. 11C is a graph illustrating the qualitative temperature characteristics of the product of the magneto-electric conversion gain of a first magnetic sensor and the first correction coefficient of the second modified example and the product of the magneto-electric conversion gain of a second magnetic sensor and the second correction coefficient of the second modified example.
Figure 11D:
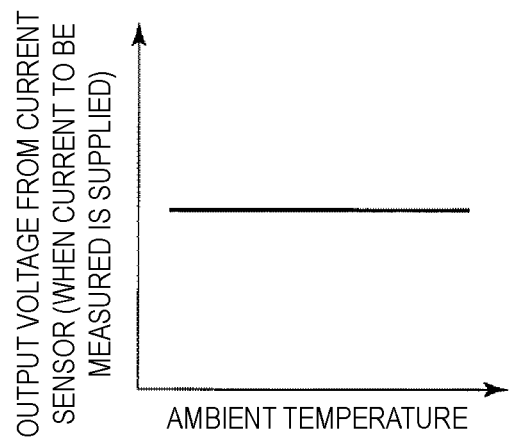
FIG. 11D is a graph illustrating the qualitative temperature characteristics of the output voltage from a current sensor of the second modified example.

FIG. 11A is a graph illustrating the qualitative temperature characteristics of first and second correction coefficients used in the second modified example. FIG. 11B is a graph illustrating the qualitative temperature characteristics of a first device correction coefficient and a first conductor correction coefficient forming the first correction coefficient shown in FIG. 11A and a second device correction coefficient and a second conductor correction coefficient forming the second correction coefficient shown in FIG. 11A. FIG. 11C is a graph illustrating the qualitative temperature characteristics of the product of the magneto-electric conversion gain of the first magnetic sensor and the first correction coefficient of the second modified example and the product of the magneto-electric conversion gain of the second magnetic sensor and the second correction coefficient of the second modified example. FIG. 11D is a graph illustrating the qualitative temperature characteristics of the output voltage from the current sensor of the second modified example.

In the first modified example, the first memory 160a stores a plurality of first correction coefficients K as the first reference table 161a in association with the individual ambient temperatures (FIG. 11A). The first correction coefficient K of the second modified example is calculated by multiplying a first device correction coefficient Kd (FIG. 11B) similar to that of the first preferred embodiment by a first conductor correction coefficient Km of the second modified example (FIG. 11B). To correct a nonlinear decrease in the output voltage from the first magnetic sensor 120a in accordance with a temperature rise, the first conductor correction coefficient Km of the second modified example is set to nonlinearly become larger as the temperature rises to be higher, as shown in FIG. 11B. With this setting, as shown in FIG. 11A, the first correction coefficient K of the second modified example nonlinearly increases as the temperature rises.

The second memory 160b stores a plurality of second correction coefficients K as the second reference table 161b in association with the individual ambient temperatures (FIG. 11A). The second correction coefficient K of the second modified example is calculated by multiplying a second device correction coefficient Kd (FIG. 11B) similar to that of the first preferred embodiment by a second conductor correction coefficient Km of the second modified example (FIG. 11B). To correct a nonlinear decrease in the output voltage from the second magnetic sensor 120b in accordance with a temperature rise, the second conductor correction coefficient Km of the second modified example is set to nonlinearly become larger as the temperature rises, as shown in FIG. 11B. With this setting, as shown in FIG. 11A, the second correction coefficient K of the second modified example nonlinearly increases as the temperature rises.

In the second modified example, the product of the magneto-electric conversion gain G of the first magnetic sensor 120a and the first correction coefficient K (Kd×Km) is set to nonlinearly become larger with respect to a temperature rise (FIG. 11C). The product of the magneto-electric conversion gain G of the second magnetic sensor 120b and the second correction coefficient K (Kd×Km) is set to nonlinearly become larger with respect to a temperature rise (FIG. 11C). With this arrangement, when a current does not flow through the conductor 110, the output voltage from the current sensor 100 becomes larger nonlinearly as the temperature rises.

With the above-described configuration, fluctuations in the output voltage from the current sensor 100 due to a temperature change when a current to be measured flows through the conductor 110 is able to be made uniform (FIG. 11D). By setting the correction coefficient with respect to the temperature to be nonlinear, the correction precision can further be enhanced.

In the above-described first preferred embodiment, the magneto-electric conversion gain of each of the first and second magnetic sensors 120a and 120b linearly changes in accordance with a temperature change. However, a change in the magneto-electric conversion gain of each of the first and second magnetic sensors 120a and 120b may not necessarily be linear.

In a third modified example, a description will be provided of a case in which the magneto-electric conversion gain of each of the first and second magnetic sensors 120a and 120b nonlinearly changes in accordance with a temperature change.

Figure 12A:
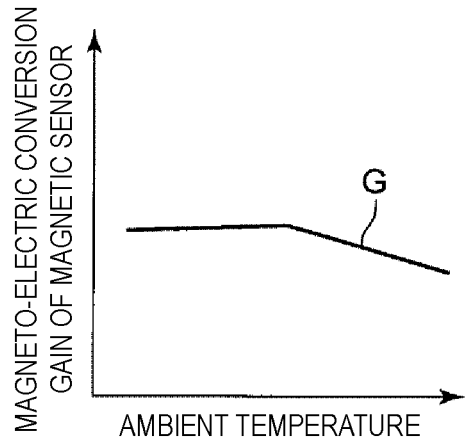
FIG. 12A is a graph illustrating the qualitative temperature characteristics of the magneto-electric conversion gains of first and second magnetic sensors of a third modified example.
Figure 12B:
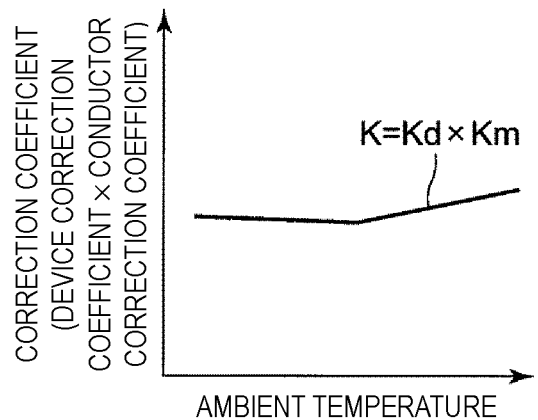
FIG. 12B is a graph illustrating the qualitative temperature characteristics of first and second correction coefficients used in the third modified example.
Figure 12C:
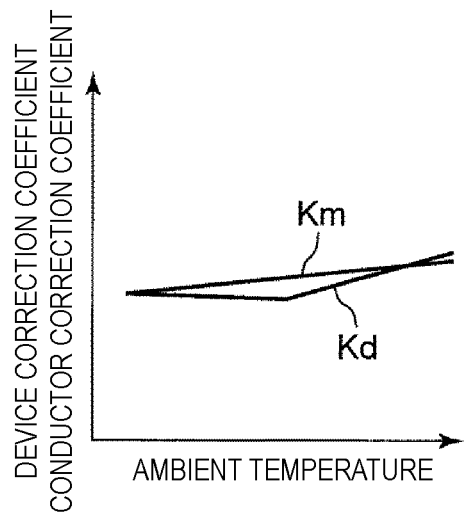
FIG. 12C is a graph illustrating the qualitative temperature characteristics of a first device correction coefficient and a first conductor correction coefficient defining the first correction coefficient shown in FIG. 12B and a second device correction coefficient and a second conductor correction coefficient defining the second correction coefficient shown in FIG. 12B.
Figure 12D:
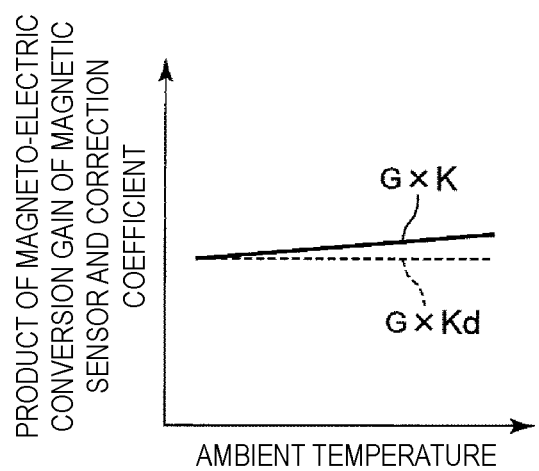
FIG. 12D is a graph illustrating the qualitative temperature characteristics of the product of the magneto-electric conversion gain of a first magnetic sensor and the first correction coefficient of the third modified example and the product of the magneto-electric conversion gain of a second magnetic sensor and the second correction coefficient of the third modified example.
Figure 12E:
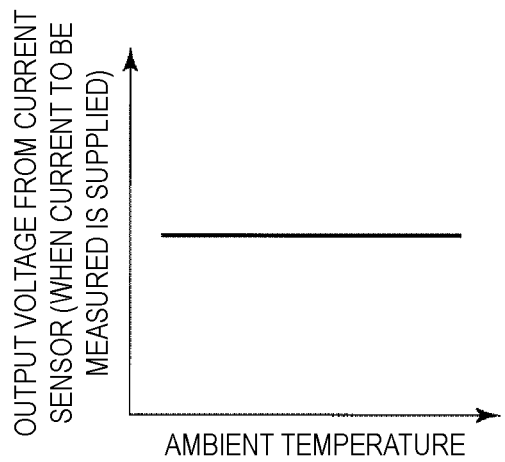
FIG. 12E is a graph illustrating the qualitative temperature characteristics of the output voltage from a current sensor of the third modified example.

FIG. 12A is a graph illustrating the qualitative temperature characteristics of the magneto-electric conversion gain of the first and second magnetic sensors of the third modified example. FIG. 12B is a graph illustrating the qualitative temperature characteristics of first and second correction coefficients used in the third modified example. FIG. 12C is a graph illustrating the qualitative temperature characteristics of a first device correction coefficient and a first conductor correction coefficient defining the first correction coefficient shown in FIG. 12B and a second device correction coefficient and a second conductor correction coefficient defining the second correction coefficient shown in FIG. 12B. FIG. 12D is a graph illustrating the qualitative temperature characteristics of the product of the magneto-electric conversion gain of the first magnetic sensor and the first correction coefficient of the third modified example and the product of the magneto-electric conversion gain of the second magnetic sensor and the second correction coefficient of the third modified example. FIG. 12E is a graph illustrating the qualitative temperature characteristics of the output voltage from the current sensor of the third modified example.

In the third modified example, the first memory 160a stores a plurality of first correction coefficients K as the first reference table 161a in association with the individual ambient temperatures (FIG. 12B). The first correction coefficient K of the third modified example is calculated by multiplying a first device correction coefficient Kd of the third modified example (FIG. 12C) by a first conductor correction coefficient Km (FIG. 12C) similar to that of the first preferred embodiment. To correct a nonlinear decrease in the magneto-electric conversion gain G of the first magnetic sensor 120a in accordance with a temperature rise (FIG. 12A), the first device correction coefficient Kd of the third modified example is set to nonlinearly become larger as the temperature rises, as shown in FIG. 12C. With this setting, as shown in FIG. 12B, the first correction coefficient K of the third modified example nonlinearly increases as the temperature rises.

The second memory 160b stores a plurality of second correction coefficients K as the second reference table 161b in association with the individual ambient temperatures (FIG. 12B). The second correction coefficient K of the third modified example is calculated by multiplying a second device correction coefficient Kd of the third modified example (FIG. 12C) by a second conductor correction coefficient Km (FIG. 12C) similar to that of the first preferred embodiment. To correct a nonlinear decrease in the magneto-electric conversion gain G of the second magnetic sensor 120b in accordance with a temperature rise (FIG. 12A), the second device correction coefficient Kd of the third modified example is set to nonlinearly become larger as the temperature rises, as shown in FIG. 12C. With this setting, as shown in FIG. 12B, the second correction coefficient K of the third modified example nonlinearly increases as the temperature rises.

In the third modified example, the product of the magneto-electric conversion gain G of the first magnetic sensor 120a and the first correction coefficient K (Kd×Km) is set to become larger with respect to a temperature rise (FIG. 12D). The product of the magneto-electric conversion gain G of the second magnetic sensor 120b and the second correction coefficient K (Kd×m) is set to become larger with respect to a temperature rise (FIG. 12D). With this configuration, when a current does not flow through the conductor 110, the output voltage from the current sensor 100 becomes larger as the temperature rises.

With the above-described configuration, fluctuations in the output voltage from the current sensor 100 due to a temperature change when a current to be measured flows through the conductor 110 are able to be made uniform (FIG. 12E). By setting the correction coefficient with respect to the temperature to be nonlinear, the correction precision is able to be further improved.

Figure 13:
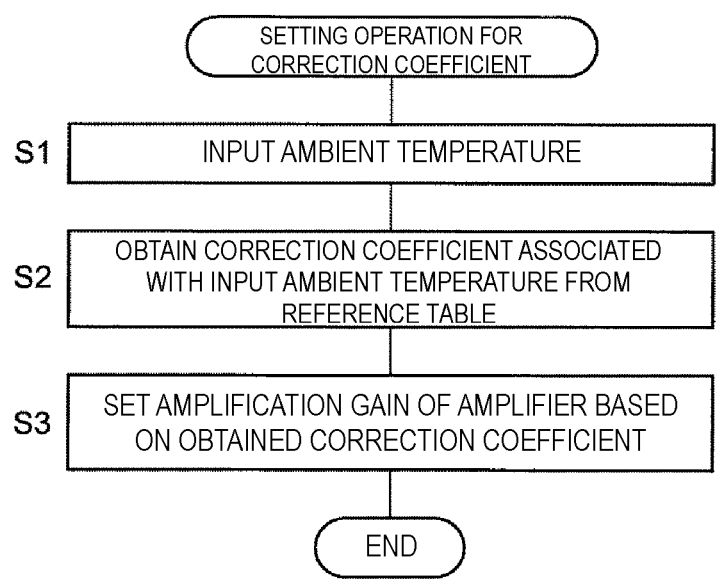
FIG. 13 is a flowchart illustrating an example of a setting operation for a first correction coefficient executed by a first corrector and an example of a setting operation for a second correction coefficient executed by a second corrector.

FIG. 13 is a flowchart illustrating a non-limiting example of a setting operation for a first correction coefficient executed by the first corrector 140a. The flowchart of FIG. 13 is executed in a state in which the first reference table 160a indicating the association between the ambient temperatures and the first correction coefficients K (see FIG. 9A) is stored in the first memory 160a.

The first corrector 140a first inputs the ambient temperature detected by the first temperature sensor 150a (S1). The first corrector 140a then refers to the first reference table 161a of the first memory 160a and obtains the first correction coefficient K associated with the input ambient temperature in accordance with the association (FIG. 9A) indicated by the first reference table 161a (S2). Then, the first corrector 140a sets the amplification gain of the amplifier 130a based on the obtained first correction coefficient K (S3).

The setting operation for the first correction coefficient executed by the first corrector 140a is not restricted to the above-described example. For example, the first corrector 140a may continuously obtain (determine) the first correction coefficient associated with the input ambient temperature and set the amplification gain of the amplifier 130a.

Alternatively, the first corrector 140a may determine the correction coefficient in a stepwise manner and set the amplification gain of the amplifier. For example, when the ambient temperature starts to deviate from the temperature used in the previous setting by a predetermined value or greater, the first corrector 140a may update the first correction coefficient and set a new amplification gain of the amplifier 130a.

The setting operation for the first correction coefficient executed by the first corrector 140a has been discussed above. The second corrector 140b may set the second correction coefficient in the same manner or similarly to the first corrector 140a.

With the above-described operation, the sensor output which is not dependent on the ambient temperature is able to be obtained, as shown in FIG. 9D.

As described above, the current sensor 100 of the present preferred embodiment includes the first and second flow passages 110a and 110b and the first and second magnetic sensors 120a and 120b. The first and second flow passages 110a and 110b are divided from the conductor 110 through which a current to be measured flows. A portion of the current flows through the first flow passage 110a, and the remaining current flows through the second flow passage 110*b*. The first magnetic sensor 120*a* detects the strength of a first magnetic field generated by the current flowing through the first flow passage 110*a*. The second magnetic sensor 120*b* detects the strength of a second magnetic field generated by the current flowing through the second flow passage 110*b*.

With this configuration, as a result of amplifying the difference between the output voltage from the first magnetic sensor 120*a* and that from the second magnetic sensor 120*b*, the current sensor 100 of the present preferred embodiment is able to obtain the output voltage twice as high as that obtained by a current sensor which does not divide a conductor and uses a single magnetic sensor, thus improving the detection sensitivity to twice as high. In the current sensor 100 of the present preferred embodiment, because of the use of differential amplification, common mode noise caused by external disturbance magnetic fields, such as magnetic fields generated by currents flowing through the conductors adjacent to each other, is able to be reduced. The current sensor 100 of the present preferred embodiment is thus able to decrease the influence of external magnetic fields while improving the sensitivity to a current flowing through the conductor 110.

In the current sensor 100 of the present preferred embodiment, the use of a magnetic core which concentrates magnetic fields is not necessary to improve the detection sensitivity. The size of the current sensor 100 is thus able to be reduced.

The current sensor 100 of the present preferred embodiment includes the first and second correctors 140*a* and 140*b*. The first corrector 140*a* corrects fluctuations in the magneto-electric conversion gain of the first magnetic sensor 120*a* caused by an ambient temperature change, and also corrects fluctuations in the output voltage from the first magnetic sensor 120*a* caused by the deformation of the first flow passage 110*a* due to an ambient temperature change. The second corrector 140*b* corrects fluctuations in the magneto-electric conversion gain of the second magnetic sensor 120*b* caused by an ambient temperature change, and also corrects fluctuations in the output voltage from the second magnetic sensor 120*b* caused by the deformation of the second flow passage 110*b* due to an ambient temperature change.

With this configuration, the current sensor 100 of the present preferred embodiment is able to reduce output errors caused by an ambient temperature change to be smaller than the related art. It is thus possible to provide a high-precision current sensor.

In the present preferred embodiment, fluctuations in the output voltages from the first and second magnetic sensors 120*a* and 120*b* due to a temperature change are first corrected by changing the amplification gains of the amplifiers 130*a* and 130*b* connected to the first and second magnetic sensors 120*a* and 120*b*, respectively. Then, the difference between the corrected output voltage from the first magnetic sensor 120*a* and that from the second magnetic sensor 120*b* is amplified. This further reduces common mode noise caused by external disturbance magnetic fields. It is thus possible to further improve resistance to external magnetic fields.

In the present preferred embodiment, the dimensions (length, width, thickness, and sectional area) of the first flow passage 110*a* and those of the second flow passage 110*b* may preferably be set to be the same or substantially the same. This makes the magnitudes of the currents split between the first and second flow passages 110*a* and 110*b* equal or substantially equal to each other. Thus, the magnetic field to be applied to the first magnetic sensor 120*a* disposed in the vicinity of the first flow passage 110*a* and that to be applied to the second magnetic sensor 120*b* disposed in the vicinity of the second magnetic passage 110*b* are able to be made the same or substantially the same.

In the present preferred embodiment, the distance between the first flow passage 110*a* and the first magnetic sensor 120*a* and that between the second flow passage 120*b* and the second magnetic sensor 120*b* may preferably be set to be equal or substantially equal to each other. This makes the amount of change in the output voltage from the first magnetic sensor 120*a* caused by the deformation of the first flow passage 110*a* be the same or substantially the same as that in the output voltage from the second magnetic sensor 120*b* caused by the deformation of the second flow passage 110*b*.

An offset voltage may be produced in the output voltage from the current sensor 100 due to the dimensional difference between the first and second flow passages 110*a* and 110*b* and the difference between the distance from the first flow passage 110*a* to the first magnetic sensor 120*a* and that from the second flow passage 110*b* to the second magnetic sensor 120*b*. To compensate for this offset voltage, the first and second correctors 140*a* and 140*b* may also adjust the offset voltage.

In the present preferred embodiment, the first temperature sensor 150*a* and the first magnetic sensor 120*a* may be sealed within the same resin package, and the second temperature sensor 150*b* and the second magnetic sensor 120*b* may be sealed within the same resin package. The ambient temperatures of the first and second magnetic sensors 120*a* and 120*b* are thus able to be measured highly precisely. As a result, it is possible to improve the precision in correcting fluctuations in the magneto-electric conversion gain of the first magnetic sensor 120*a* caused by an ambient temperature change and those of the second magnetic sensor 120*b* caused by an ambient temperature change.

In the present preferred embodiment, the first temperature sensor 150*a* may be disposed in the vicinity of the first flow passage 110*a*, and the second temperature sensor 150*b* may be disposed in the vicinity of the second flow passage 110*b*. The ambient temperatures of the first and second flow passages 110*a* and 110*b* are thus able to be measured highly precisely. As a result, it is possible to improve the precision in correcting fluctuations in the output voltage from the first magnetic sensor 120*a* caused by the deformation of the first flow passage 110*a* due to an ambient temperature change and those in the output voltage from the second magnetic sensor 120*b* caused by the deformation of the second flow passage 110*b* due to an ambient temperature change.

As in the present preferred embodiment, in the configuration in which a conductor is divided and the difference in the output voltage between two magnetic sensors is amplified, output errors of the magnetic sensors caused by the deformation of the divided conductors are increased by about twice as high as that in the configuration of the related art in which a conductor is not divided and a single magnetic sensor is used. From this point of view, correcting fluctuations in the output voltages from the magnetic sensors caused by a temperature change according to the present invention is suitably applied to the current sensor 100 of the present preferred embodiment in which the conductor 110 is divided and the difference in the output voltage between the two magnetic sensors 120*a* and 120*b* is amplified.

To reduce the deformation of a conductor caused by a current supply, the sectional area of the conductor may be increased to decrease the amount of heat generated in the conductor. This, however, increases the size of the current sensor. In the present preferred embodiment, instead of increasing the sectional area of the first and second flow passages 110a and 110b, the first corrector 140a is able to correct fluctuations in the output voltage from the first magnetic sensor 120a caused by the deformation of the first flow passage 110a, and the second corrector 140b is able to correct fluctuations in the output voltage from the second magnetic sensor 120b caused by the deformation of the second flow passage 110b. It is thus possible to provide a small current sensor.

Second Preferred Embodiment

In the first preferred embodiment, the corrector 140a corrects the amplification gain of the amplifier 130a, while the corrector 140b corrects the amplification gain of the amplifier 130b. In a second preferred embodiment of the present invention, a configuration in which a single corrector corrects the amplification gain of one amplifier will be discussed. That is, in the second preferred embodiment, fluctuations in the output voltage from the first magnetic sensor 120a and those from the second magnetic sensor 120b are corrected together by using the amplification gain of one amplifier.

Figure 14:
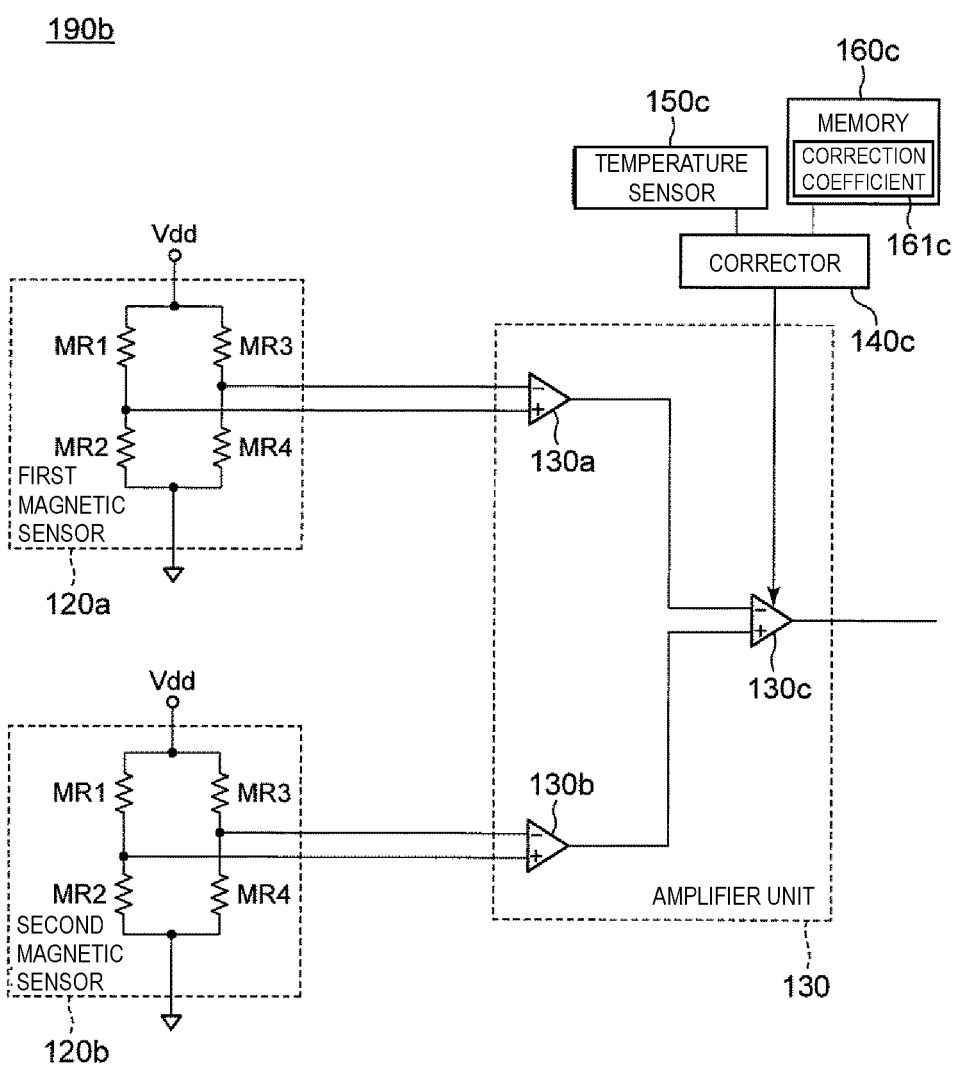
FIG. 14 is a block diagram illustrating the electrical configuration of a magnetic sensor unit of a current sensor according to a second preferred embodiment of the present invention.

FIG. 14 is a block diagram illustrating the electrical configuration of a magnetic sensor unit 190b of a current sensor according to the second preferred embodiment. As shown in FIG. 14, the magnetic sensor unit 190b of the current sensor 100 of the second preferred embodiment includes a corrector 140c, instead of the first and second correctors 140a and 140b of the magnetic sensor unit 190 of the first preferred embodiment. The magnetic sensor unit 190b of the present preferred embodiment also includes a temperature sensor 150c, instead of the first and second temperature sensors 150a and 150b in the first embodiment and also includes a memory 160c, instead of the first and second memories 160a and 160b in the first preferred embodiment.

The amplifier 130c includes a gain control terminal and changes the amplification gain under the control of the corrector 140.

The temperature sensor 150c is located, for example, at a middle portion between the first and second flow passages 110a and 110b in the widthwise direction (X-axis direction), and measures the ambient temperature of the first flow passage 110a and the first magnetic sensor 120a and that of the second flow passage 110b and the second magnetic sensor 120b.

The memory 160c stores a plurality of correction coefficients K as a reference table 161c in association with the individual ambient temperatures. The correction coefficient K is calculated by multiplying two device correction coefficients Kd and two conductor correction coefficient Km by each other. One device correction coefficient Kd is used to correct fluctuations in the magneto-electric conversion gain of the first magnetic sensor 120a caused by an ambient temperature change. The other device correction coefficient Kd is used to correct fluctuations in the magneto-electric conversion gain of the second magnetic sensor 120b caused by an ambient temperature change. One conductor correction coefficient Km is used to correct fluctuations in the output voltage from the first magnetic sensor 120a caused by the deformation of the first flow passage 110a due to an ambient temperature change. The other conductor correction coefficient Km is used to correct fluctuations in the output voltage from the second magnetic sensor 120b caused by the deformation of the second flow passage 110b due to an ambient temperature change.

The corrector 140c refers to the reference table 161c of the correction coefficients K stored in the memory 160c so as to determine the correction coefficient K associated with the ambient temperature detected by the temperature sensor 150c. The corrector 140c changes the amplification gain of the amplifier 130c of the amplifier unit 130, based on the determined correction coefficient K.

With the current sensor 100 of the present preferred embodiment, advantages similar to those of the first preferred embodiment are also able to be obtained. That is, in the current sensor 100 of the present preferred embodiment, the corrector 140c corrects fluctuations in the magneto-electric conversion gains of the first and second magnetic sensors 120a and 120b caused by an ambient temperature change, and also corrects fluctuations in the output voltages from the first and second magnetic sensors 120a and 120b caused by the deformation of the first and second flow passages 110a and 110b due to an ambient temperature change. With this configuration, the current sensor 100 of the present preferred embodiment is able to reduce output errors caused by an ambient temperature change to be smaller than the related art. It is thus possible to provide a high-precision current sensor.

Third Preferred Embodiment

In the first preferred embodiment, the amplification gains of the amplifiers 130a and 130b of the amplifier unit 130, which are output stages of the first and second magnetic sensors 120a and 120b, are corrected. In a third preferred embodiment of the present invention, the magneto-electric conversion gains of the first and second magnetic sensors 120a and 120b are corrected.

Figure 15:
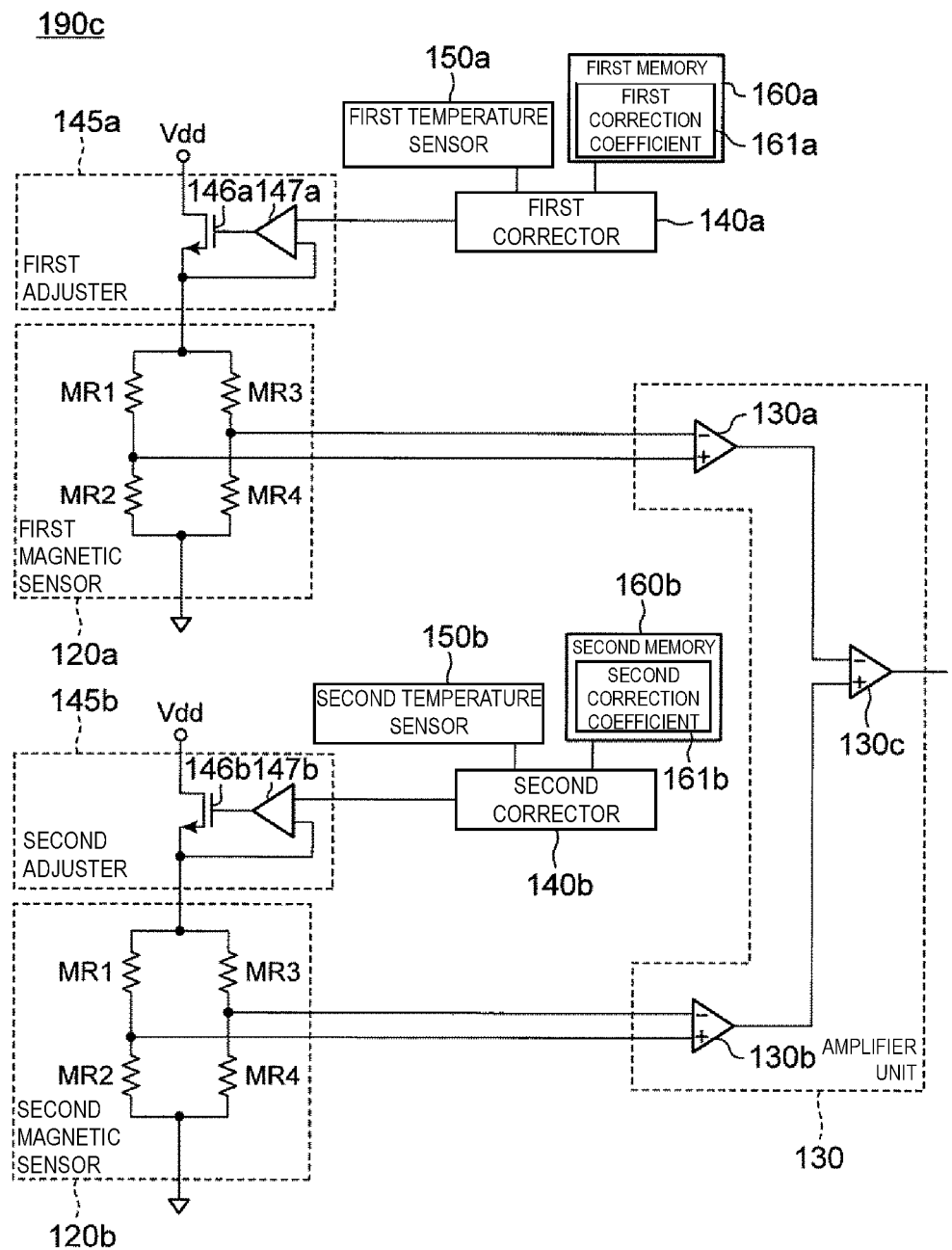
FIG. 15 is a block diagram illustrating the electrical configuration of a magnetic sensor unit of a current sensor according to a third preferred embodiment of the present invention.

FIG. 15 is a block diagram illustrating the electrical configuration of a magnetic sensor unit 190c of a current sensor according to the third preferred embodiment. As shown in FIG. 15, the magnetic sensor unit 190c of the current sensor 100 of the third preferred embodiment is different from the magnetic sensor unit 190 of the first preferred embodiment in that it also includes first and second adjusters 145a and 145b.

The first adjuster 145a is connected between the first magnetic sensor 120a and a power supply terminal Vdd. The first adjuster 145a receives a power supply voltage applied from the power supply terminal Vdd and adjusts the drive voltage (drive current) to be input into the first magnetic sensor 120a under the control of the first corrector 140a. The first adjuster 145a includes a transistor 146a and an amplifier 147a. The transistor 146a is preferably an FET, for example. The drain terminal of the transistor 146a is connected to the power supply terminal Vdd, the source terminal is connected to the first magnetic sensor 120a, and the gate terminal is connected to the output terminal of the amplifier 147a. One input terminal of the amplifier 147a is connected to the first corrector 140a, and the other input terminal is connected to the source terminal of the transistor 146a.

The second adjuster 145b is connected between the second magnetic sensor 120b and a power supply terminal Vdd. The second adjuster 145b receives a power supply voltage applied from the power supply terminal Vdd and adjusts the drive voltage (drive current) to be input into the second magnetic sensor 120b under the control of the second corrector 140b. The second adjuster 145b includes a transistor 146b and an amplifier 147b. The transistor 146b is preferably an FET, for example. The drain terminal of the transistor 146b is connected to the power supply terminal Vdd, the source terminal is connected to the second magnetic sensor 120b, and the gate terminal is connected to the output terminal of the amplifier 147b. One input terminal of the amplifier 147b is connected to the second corrector 140b, and the other input terminal is connected to the source terminal of the transistor 146b.

In the present preferred embodiment, FETs are used as the transistors 146a and 146b by way of example. However, the transistors 146a and 146b are not limited to FETs, and may be another type of transistor, such as a bipolar transistor, for example. Instead of the transistors 146a and 146b, variable resistors, for example, may be used.

The first temperature sensor 150a measures the ambient temperature of the first flow passage 110a and the first magnetic sensor 120a, and the second temperature sensor 150b measures the ambient temperature of the second flow passage 110b and the second magnetic sensor 120b.

The first memory 160a stores a plurality of correction coefficients K as the reference table 161a in association with the individual ambient temperatures. The correction coefficient K is calculated by multiplying a device correction coefficient Kd by a conductor correction coefficient Km. The device correction coefficient Kd is used to correct fluctuations in the magneto-electric conversion gain of the first magnetic sensor 120a caused by an ambient temperature change. The conductor correction coefficient Km is used to correct fluctuations in the output voltage from the first magnetic sensor 120a caused by the deformation of the first flow passage 110a due to an ambient temperature change.

The second memory 160b stores a plurality of correction coefficients K as the reference table 161b in association with the individual ambient temperatures. The correction coefficient K is calculated by multiplying a device correction coefficient Kd by a conductor correction coefficient Km. The device correction coefficient Kd is used to correct fluctuations in the magneto-electric conversion gain of the second magnetic sensor 120b caused by an ambient temperature change. The conductor correction coefficient Km is used to correct fluctuations in the output voltage from the second magnetic sensor 120b caused by the deformation of the second flow passage 110b due to an ambient temperature change.

The first corrector 140a refers to the reference table 161a of the correction coefficients K stored in the first memory 160a so as to determine the correction coefficient K associated with the ambient temperature detected by the first temperature sensor 150a. The first corrector 140a controls the first adjuster 145a based on the determined correction coefficient K so as to control the drive voltage (drive current) of the first magnetic sensor 120a. In this manner, the first corrector 140a corrects the magneto-electric conversion gain of the first magnetic sensor 120a.

The second corrector 140b refers to the reference table 161b of the correction coefficients K stored in the second memory 160b so as to determine the correction coefficient K associated with the ambient temperature detected by the second temperature sensor 150b. The second corrector 140b controls the second adjuster 145b based on the determined correction coefficient K so as to control the drive voltage (drive current) of the second magnetic sensor 120b. In this manner, the second corrector 140b corrects the magneto-electric conversion gain of the second magnetic sensor 120b.

With the current sensor 100 of the present preferred embodiment, advantages similar to those of the first preferred embodiment are able to be obtained. That is, in the current sensor 100 of the present preferred embodiment, the first corrector 140a corrects fluctuations in the magneto-electric conversion gain of the first magnetic sensor 120a caused by an ambient temperature change, and also corrects fluctuations in the output voltage from the first magnetic sensor 120a caused by the deformation of the first flow passage 110a due to an ambient temperature change. Similarly, the second corrector 140b corrects fluctuations in the magneto-electric conversion gain of the second magnetic sensor 120b caused by an ambient temperature change, and also corrects fluctuations in the output voltage from the second magnetic sensor 120b caused by the deformation of the second flow passage 110b. With this configuration, the current sensor 100 of the present preferred embodiment is able to reduce output errors caused by an ambient temperature change to be smaller than the related art. It is thus possible to provide a high-precision current sensor.

Fourth Preferred Embodiment

In the first preferred embodiment, corrections are conducted by digital processing using the correctors 140a and 140b, the temperature sensors 150a and 150b, and the memories 160a and 160b. In a fourth preferred embodiment of the present invention, corrections are conducted by analog processing using circuit devices having temperature response characteristics.

Figure 16:
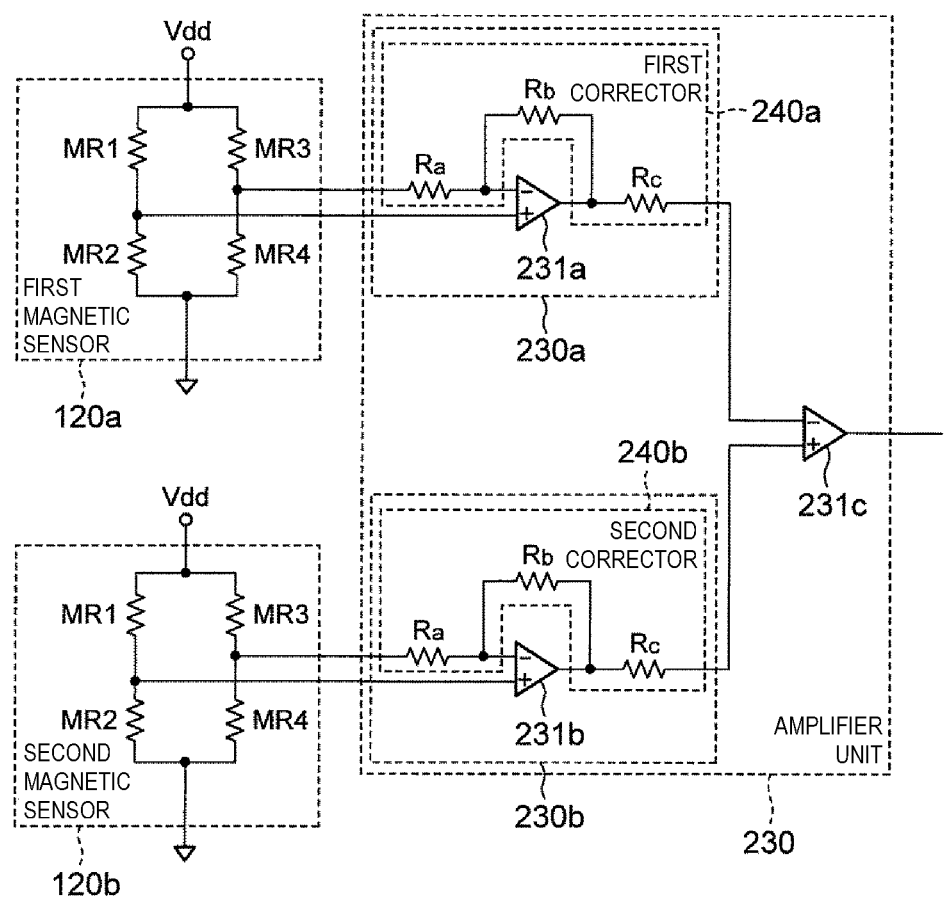
FIG. 16 is a block diagram illustrating the electrical configuration of a magnetic sensor unit of a current sensor according to a fourth preferred embodiment of the present invention.

FIG. 16 is a block diagram illustrating the electrical configuration of a magnetic sensor unit 190d of a current sensor according to the fourth preferred embodiment. As shown in FIG. 16, the magnetic sensor unit 190d of the current sensor 100 of the fourth preferred embodiment includes an amplifier unit 230, instead of the amplifier unit 130 of the magnetic sensor unit 190 of the first preferred embodiment.

The amplifier unit 230 includes first and second amplifier circuits 230a and 230b and an amplifier 231c. The first amplifier circuit 230a includes an amplifier 231a and resistors Ra, Rb, and Rc. The second amplifier circuit 230b includes an amplifier 231b and resistors Ra, Rb, and Rc.

The first amplifier circuit 230a amplifies the output voltage from the first magnetic sensor 120a. The second amplifier circuit 230b amplifies the output voltage from the second magnetic sensor 120b. The amplifier 231c amplifies the difference between the output voltage from the amplifier 230a and that from the amplifier 230b.

In the first amplifier circuit 230a, the resistor Ra is connected between the negative input terminal of the amplifier 231a and a node between the magneto resistance elements MR3 and MR4 of the first magnetic sensor 120a. The resistor Rb is connected between the negative input terminal and the output terminal of the amplifier 231a. The resistor Rc is connected between the output terminal of the amplifier 231a and the negative input terminal of the amplifier 231c. The positive input terminal of the amplifier 231a is connected to a node between the magneto resistance elements MR1 and MR2 of the first magnetic sensor 120a.

The resistors Ra, Rb, and Rc of the first amplifier circuit 230a set the amplification gain of the first amplifier circuit 230a and also define and function as a first corrector 240a that corrects fluctuations in the output voltage from the first magnetic sensor 120a caused by a temperature change. The resistance values of the resistors Ra, Rb, and Rc vary in accordance with an ambient temperature change. In the present preferred embodiment, the resistance values of the resistors Ra, Rb, and Rc are determined so as to cancel fluctuations in the magneto-electric conversion gain of the first magnetic sensor 120a caused by an ambient temperature change and also to cancel fluctuations in the output voltage from the first magnetic sensor 120a caused by the deformation of the first flow passage 110a due to an ambient temperature change.

Similarly, in the second amplifier circuit 230b, the resistor Ra is connected between the negative input terminal of the amplifier 231b and a node between the magneto resistance elements MR3 and MR4 of the second magnetic sensor 120b. The resistor Rb is connected between the negative input terminal and the output terminal of the amplifier 231b. The resistor Rc is connected between the output terminal of the amplifier 231b and the positive input terminal of the amplifier 231c. The positive input terminal of the amplifier 231b is connected to a node between the magneto resistance elements MR1 and MR2 of the second magnetic sensor 120b.

The resistors Ra, Rb, and Rc of the second amplifier circuit 230b set the amplification gain of the second amplifier circuit 230b and also define and function as a second corrector 240b that corrects fluctuations in the output voltage from the second magnetic sensor 120b caused by a temperature change. In the present preferred embodiment, the resistance values of the resistors Ra, Rb, and Rc are determined so as to cancel fluctuations in the magneto-electric conversion gain of the second magnetic sensor 120b caused by an ambient temperature change and also to cancel fluctuations in the output voltage from the second magnetic sensor 120b caused by the deformation of the second flow passage 110b due to an ambient temperature change.

In the present preferred embodiment, the first and second correctors 240a and 240b each include the resistors Ra, Rb, and Rc as an example. However, the first and second correctors 240a and 240b are not limited to this configuration and may include thermistors, diodes, and Pt (platinum resistor) sensors, for example, instead of resistors.

With the current sensor 100 of the present preferred embodiment, advantages similar to those of the first preferred embodiment are able to be obtained. That is, in the current sensor 100 of the present preferred embodiment, the first and second correctors 240a and 240b each include the resistors Ra, Rb, and Rc having characteristics in which the resistance value varies in accordance with a temperature change. With those characteristics, the first corrector 240a corrects fluctuations in the magneto-electric conversion gain of the first magnetic sensor 120a caused by an ambient temperature change, and also corrects fluctuations in the output voltage from the first magnetic sensor 120a caused by the deformation of the first flow passage 110a due to an ambient temperature change. Similarly, the second corrector 240b corrects fluctuations in the magneto-electric conversion gain of the second magnetic sensor 120b caused by an ambient temperature change, and also corrects fluctuations in the output voltage from the second magnetic sensor 120b caused by the deformation of the second flow passage 110b. With this configuration, the current sensor 100 of the present preferred embodiment is able to reduce output errors caused by an ambient temperature change to be smaller than the related art. It is thus possible to provide a high-precision current sensor.

Fifth Preferred Embodiment

In the second preferred embodiment, corrections are conducted by digital processing using the corrector 140c, the temperature sensor 150c, and the memory 160c. In a fifth preferred embodiment of the present invention, corrections are conducted by analog processing using circuit devices having temperature response characteristics.

Figure 17:
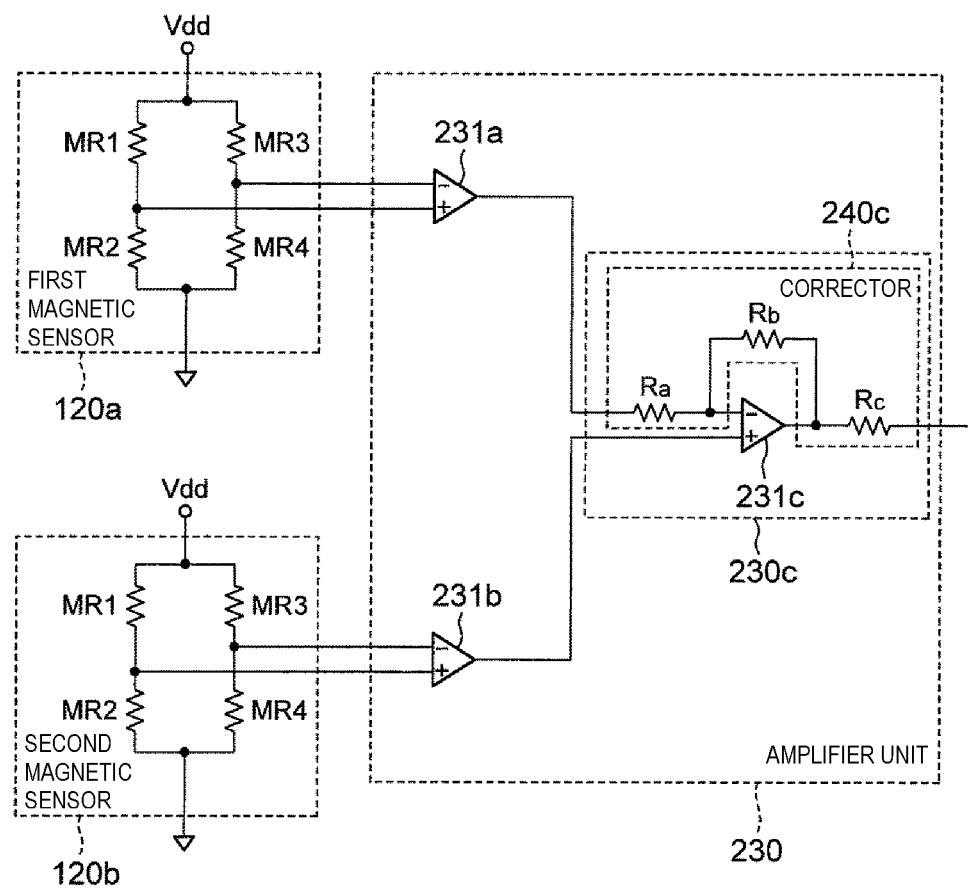
FIG. 17 is a block diagram illustrating the electrical configuration of a magnetic sensor unit of a current sensor according to a fifth preferred embodiment of the present invention.

FIG. 17 is a block diagram illustrating the electrical configuration of a magnetic sensor unit 190e of a current sensor according to the fifth preferred embodiment. As shown in FIG. 17, the magnetic sensor unit 190e of the current sensor 100 of the fifth preferred embodiment includes an amplifier unit 230, instead of the amplifier unit 130 of the magnetic sensor unit 190b of the second preferred embodiment.

The amplifier unit 230 includes amplifiers 231a and 231b and an amplifier circuit 230c. The amplifier circuit 230c includes an amplifier 231c and resistors Ra, Rb, and Rc.

The negative input terminal of the amplifier 231a is connected to a node between the magneto resistance elements MR3 and MR4 of the first magnetic sensor 120a. The positive input terminal of the amplifier 231a is connected to a node between the magneto resistance elements MR1 and MR2 of the first magnetic sensor 120a. The amplifier 231a amplifies the output voltage from the first magnetic sensor 120a.

The negative input terminal of the amplifier 231b is connected to a node between the magneto resistance elements MR3 and MR4 of the second magnetic sensor 120b. The positive input terminal of the amplifier 231b is connected to a node between the magneto resistance elements MR1 and MR2 of the second magnetic sensor 120b. The amplifier 231b amplifies the output voltage from the second magnetic sensor 120b.

In the amplifier circuit 230c, the resistor Ra is connected between the negative input terminal of the amplifier 231c and the output terminal of the amplifier 231a. The resistor Rb is connected between the negative input terminal and the output terminal of the amplifier 231c. The resistor Rc is connected between the output terminal of the amplifier 231c and a circuit device of a subsequent stage. The positive input terminal of the amplifier 231c is connected to the output terminal of the amplifier 231b. The amplifier 230c amplifies the difference between the output voltage from the amplifier 231a and that from the amplifier 231b.

The resistors Ra, Rb, and Rc of the amplifier circuit 230c set the amplification gain of the amplifier circuit 230c and also define and function as a corrector 240c that corrects fluctuations in the output voltage from the first magnetic sensor 120a caused by a temperature change. The resistance values of the resistors Ra, Rb, and Rc vary in accordance with an ambient temperature change. In the present preferred embodiment, the resistance values of the resistors Ra, Rb, and Rc are determined so as to cancel fluctuations in the magneto-electric conversion gain of the first magnetic sensor 120a caused by an ambient temperature change and those of the second magnetic sensor 120b caused by an ambient temperature change, and also to cancel fluctuations in the output voltage from the first magnetic sensor 120a caused by the deformation of the first flow passage 110a due to an ambient temperature change and those in the output voltage from the current sensor 100 caused by the deformation of the second flow passage 110b due to an ambient temperature change.

With the current sensor 100 of the present preferred embodiment, advantages similar to those of the first preferred embodiment are able to be obtained. That is, in the current sensor 100 of the present preferred embodiment, the corrector 240c includes the resistors Ra, Rb, and Rc having characteristics in which the resistance value varies in accordance with a temperature change. The corrector 240c corrects fluctuations in the magneto-electric conversion gains of the first and second magnetic sensors 120a and 120b caused by an ambient temperature change, and also corrects fluctuations in the output voltages from the first and second magnetic sensors 120a and 120b caused by the deformation of the first and second flow passages 110a and 110b due to an ambient temperature change. With this configuration, the current sensor 100 of the present preferred embodiment is able to reduce output errors caused by an ambient temperature change to be smaller than the related art. It is thus possible to provide a high-precision current sensor.

Sixth Preferred Embodiment

In the third preferred embodiment, corrections are conducted by digital processing using the correctors 140a and 140b, the temperature sensors 150a and 150b, the memories 160a and 160b, and the adjusters 145a and 145b. In a sixth preferred embodiment of the present invention, corrections are conducted by analog processing using circuit devices having temperature response characteristics.

Figure 18:
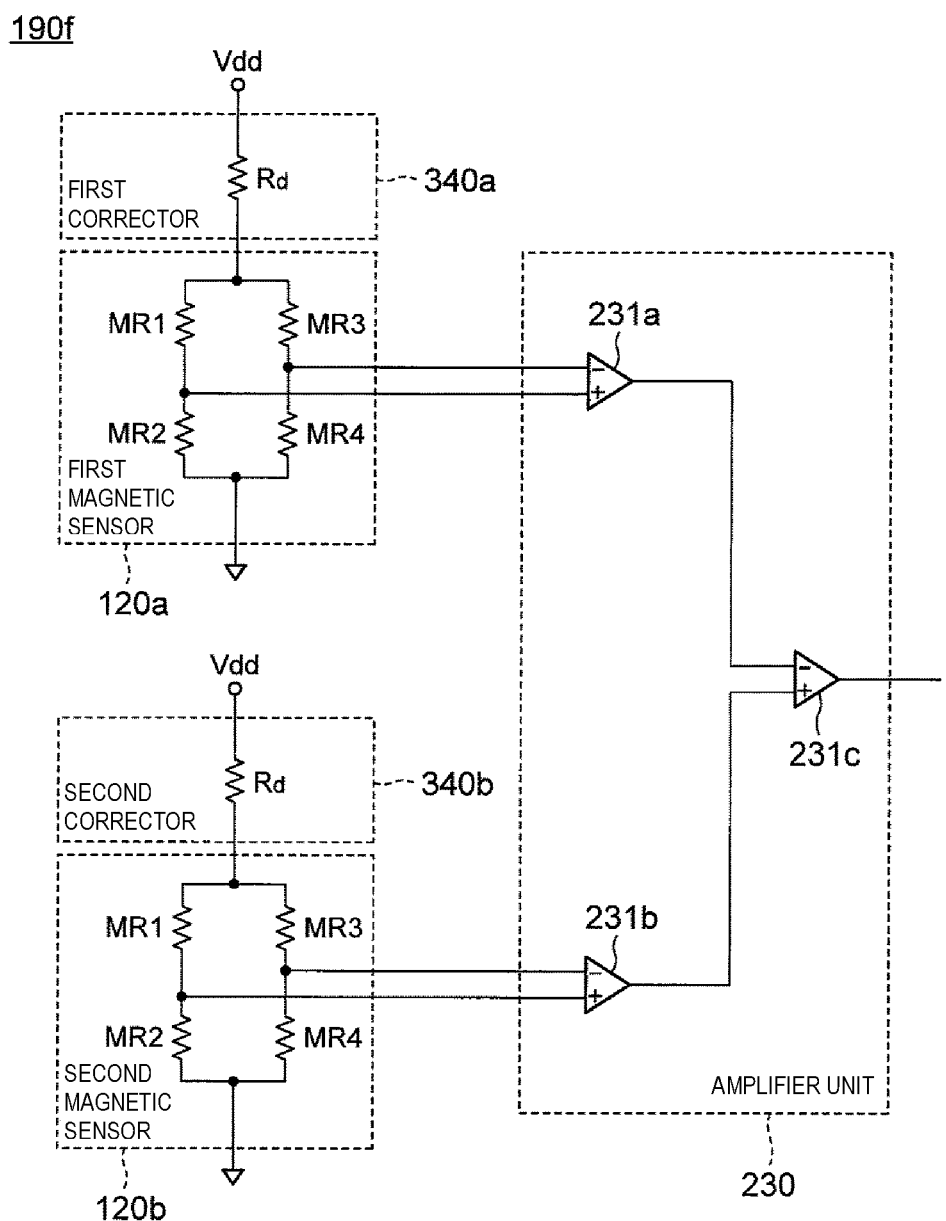
FIG. 18 is a block diagram illustrating the electrical configuration of a magnetic sensor unit of a current sensor according to a sixth preferred embodiment of the present invention.

FIG. 18 is a block diagram illustrating the electrical configuration of a magnetic sensor unit 190f of a current sensor according to the sixth preferred embodiment. As shown in FIG. 18, the magnetic sensor unit 190f of the current sensor 100 of the sixth preferred embodiment includes an amplifier unit 230, instead of the amplifier unit 130 of the magnetic sensor unit 190c of the third preferred embodiment. The magnetic sensor unit 190f also includes a first corrector 340a, instead of the first corrector 140a, the first temperature sensor 150a, the first memory 160a, and the first adjuster 145a of the third preferred embodiment. The magnetic sensor unit 190f also includes a second corrector 340c, instead of the second corrector 140b, the second temperature sensor 150b, the second memory 160b, and the second adjuster 145b of the third preferred embodiment.

The amplifier unit 230 includes amplifiers 231a, 231b, and 231c.

The negative input terminal of the amplifier 231a is connected to a node between the magneto resistance elements MR3 and MR4 of the first magnetic sensor 120a. The positive input terminal of the amplifier 231a is connected to a node between the magneto resistance elements MR1 and MR2 of the first magnetic sensor 120a. The amplifier 231a amplifies the output voltage from the first magnetic sensor 120a.

The negative input terminal of the amplifier 231b is connected to a node between the magneto resistance elements MR3 and MR4 of the second magnetic sensor 120b. The positive input terminal of the amplifier 231b is connected to a node between the magneto resistance elements MR1 and MR2 of the second magnetic sensor 120b. The amplifier 231b amplifies the output voltage from the second magnetic sensor 120b.

The negative input terminal of the amplifier 231c is connected to the output terminal of the amplifier 231a. The positive input terminal of the amplifier 231c is connected to the output terminal of the amplifier 231b. The amplifier 231c amplifies the difference between the output voltage from the amplifier 231a and that from the amplifier 231b.

The first corrector 340a is connected between the first magnetic sensor 120a and a power supply terminal Vdd. The first corrector 340a includes a resistor Rd.

The resistance value of the resistor Rd varies in accordance with an ambient temperature change. In the present preferred embodiment, the resistance values of the resistors Ra, Rb, and Rc are determined so as to cancel fluctuations in the magneto-electric conversion gain of the first magnetic sensor 120a caused by an ambient temperature change and also to cancel fluctuations in the output voltage from the current sensor 100 caused by the deformation of the first flow passage 110a due to an ambient temperature change. The first corrector 240a controls the drive voltage (drive current) of the first magnetic sensor 120a so as to correct the magneto-electric conversion gain of the first magnetic sensor 120a.

The second corrector 340b is connected between the second magnetic sensor 120b and a power supply terminal Vdd. The second corrector 340b includes a resistor Rd.

The resistance value of the resistor Rd varies in accordance with an ambient temperature change. In the present preferred embodiment, the resistance values of the resistors Ra, Rb, and Rc are determined so as to cancel fluctuations in the magneto-electric conversion gain of the second magnetic sensor 120b caused by an ambient temperature change and also to cancel fluctuations in the output voltage from the current sensor 100 caused by the deformation of the second flow passage 110b due to an ambient temperature change. The second corrector 240b controls the drive voltage (drive current) of the second magnetic sensor 120b so as to correct the magneto-electric conversion gain of the second magnetic sensor 120b.

With the current sensor 100 of the present preferred embodiment, advantages similar to those of the third preferred embodiment are able to be obtained. That is, in the current sensor 100 of the present preferred embodiment, the first and second correctors 240a and 240b each include the resistor Rd having characteristics in which the resistance value varies in accordance with a temperature change. The first corrector 240a corrects fluctuations in the magneto-electric conversion gain of the first magnetic sensor 120a caused by an ambient temperature change, and also corrects fluctuations in the output voltage from the first magnetic sensor 120a caused by the deformation of the first flow passage 110a due to an ambient temperature change. Similarly, the second corrector 240b corrects fluctuations in the magneto-electric conversion gain of the second magnetic sensor 120b caused by an ambient temperature change, and also corrects fluctuations in the output voltage from the second magnetic sensor 120b caused by the deformation of the second flow passage 110b. With this configuration, the current sensor 100 of the present preferred embodiment is able to reduce output errors caused by an ambient temperature change to be smaller than the related art. It is thus possible to provide a high-precision current sensor.

Seventh Preferred Embodiment

In the current sensor of the first preferred embodiment, the conductor 110 is divided into the two flow passages 110a and 110b, and the magnetic fields generated around the flow passages 110a and 110b are detected, and then, the difference between the detected magnetic fields is amplified. Temperature correction is conducted in this current sensor. In a seventh preferred embodiment of the present invention, temperature correction is conducted in a current sensor including a conductor which is not divided.

Figure 19:
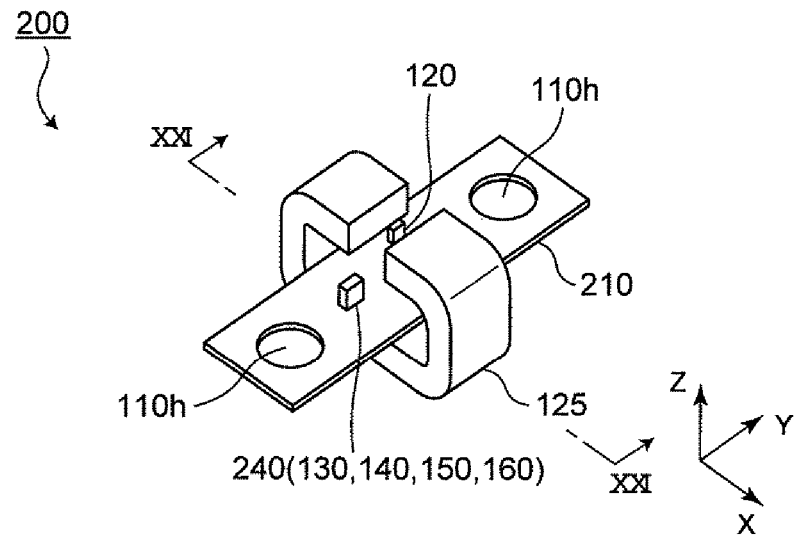
FIG. 19 is a perspective view illustrating the external appearance of a current sensor according to a seventh preferred embodiment of the present invention.
Figure 20:
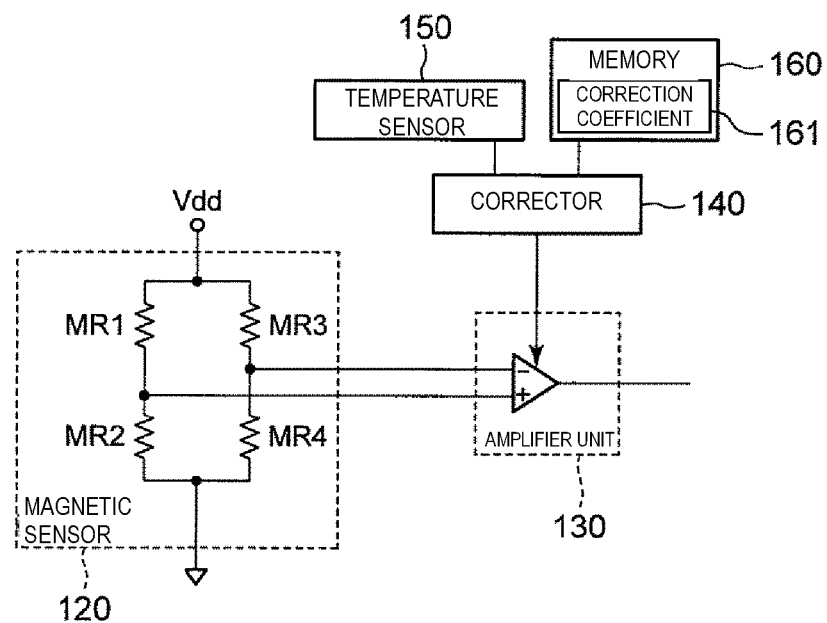
FIG. 20 is a block diagram illustrating the electrical configuration of a magnetic sensor and electronic components shown in FIG. 19.

FIG. 19 is a perspective view illustrating the external appearance of a current sensor according to the seventh preferred embodiment. FIG. 20 is a block diagram illustrating the electrical configuration of a magnetic sensor and electronic components shown in FIG. 19.

As shown in FIG. 19, a current sensor 200 of the present preferred embodiment includes a conductor 210, a magnetic core 125, a magnetic sensor 120, and electronic components 240.

As shown in FIG. 19, the conductor 210 is different from the conductor 110 in that it is not divided into two passages, unlike the first and second flow passages 110a and 110b of the first preferred embodiment.

The magnetic core 125 preferably has a substantially ring shape and is disposed to surround the conductor 210. The magnetic core 125 concentrates magnetic fields generated around the conductor 110. The magnetic core 125 includes a gap in a portion of the ring shape. As the material for the magnetic core 125, a magnetic material, such as silicon steel or permalloy, for example, is preferably used. The magnetic core 125 is preferably a multilayer core or a cut core, for example.

The magnetic sensor 120 is disposed within the gap of the magnetic core 125. The magnetic sensor 120 detects the strength of the magnetic field generated by a current flowing through the conductor 110.

The electronic components 240 include an amplifier unit 130, a corrector 140, a temperature sensor 150, and a memory 160.

The magnetic sensor 120 and the electronic components 240 will be discussed below with reference to FIG. 20. As the magnetic sensor 120, a magnetic sensor similar to the above-described first and second magnetic sensors 120a and 120b is used, as shown in FIG. 20.

The amplifier unit 130 amplifies the output voltage from the magnetic sensor 120. The amplifier unit 130 includes a gain control terminal and changes the amplification gain under the control of the corrector 140.

The temperature sensor 150 measures the ambient temperature of the conductor 210 and the magnetic sensor 120.

The memory 160 stores a plurality of correction coefficients as a reference table 161 in association with the individual ambient temperatures. The correction coefficient is calculated by multiplying a device correction coefficient by a conductor correction coefficient. The device correction coefficient is used to correct fluctuations in the magneto-electric conversion gain of the magnetic sensor 120 caused by an ambient temperature change. The conductor correction coefficient is used to correct fluctuations in the output voltage from the magnetic sensor 120 caused by the deformation of the conductor 110 due to an ambient temperature change. The memory 160 also stores a program to provide various functions of the corrector 140.

The corrector 140 refers to the reference table 161 of the correction coefficients stored in the memory 160 so as to determine the correction coefficient associated with the ambient temperature detected by the temperature sensor 150. The corrector 140 changes the amplification gain of the amplifier unit 130, based on the determined correction coefficient.

Figure 21:
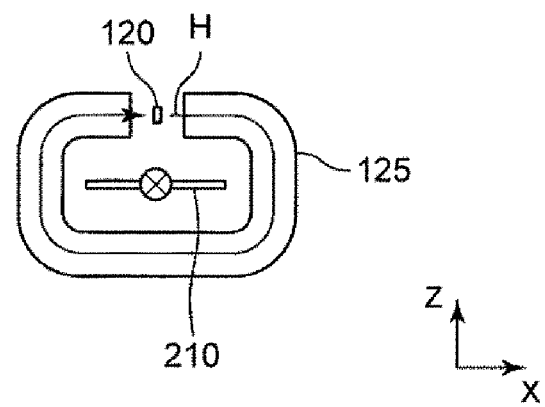
FIG. 21 is a sectional view of the current sensor shown in FIG. 19, as viewed from the direction indicated by the arrow of line XXI-XXI in FIG. 19.

FIG. 21 is a sectional view of the current sensor according to the seventh preferred embodiment, as viewed from the direction indicated by the arrow of line XXI-XXI in FIG. 19.

When a current to be measured flows through the conductor 210 in the lengthwise-direction (Y-axis direction), a magnetic field H is generated around the conductor 210. The magnetic field H is concentrated at the magnetic core 125 and is applied to the magnetic sensor 120. The magnetic sensor 120 detects the strength of the magnetic field H and outputs a voltage corresponding to the strength of the magnetic field H. In this manner, the magnetic field is concentrated by the magnetic core 125, so that the current sensor 200 has improved detection sensitivity.

As shown in FIG. 20, the amplifier unit 130 amplifies the output voltage from the magnetic sensor 120. At this time, the corrector 140 refers to the reference table 161 of the correction coefficients stored in the memory 160 so as to determine the correction coefficient associated with the ambient temperature detected by the temperature sensor 150. The corrector 140 changes the amplification gain of the amplifier unit 130, based on the determined correction coefficient.

With the current sensor 200 of the present preferred embodiment, advantages similar to those of the first preferred embodiment are able to be obtained. That is, in the current sensor 200 of the present preferred embodiment, the corrector 140 corrects fluctuations in the magneto-electric conversion gain of the magnetic sensor 120 caused by an ambient temperature change, and also corrects fluctuations in the output voltage from the magnetic sensor 120 caused by the deformation of the conductor 110 due to an ambient temperature change. With this configuration, the current sensor 200 of the present preferred embodiment is able to reduce output errors caused by an ambient temperature change to be smaller than the related art. It is thus possible to provide a high-precision current sensor.

In the seventh preferred embodiment, the current sensor 200 includes the linearly extending conductor 110. In modified examples of the seventh preferred embodiment, the current sensor 200 includes a partially bending conductor. Examples of such a current sensor 200 will be discussed.

Figure 22:
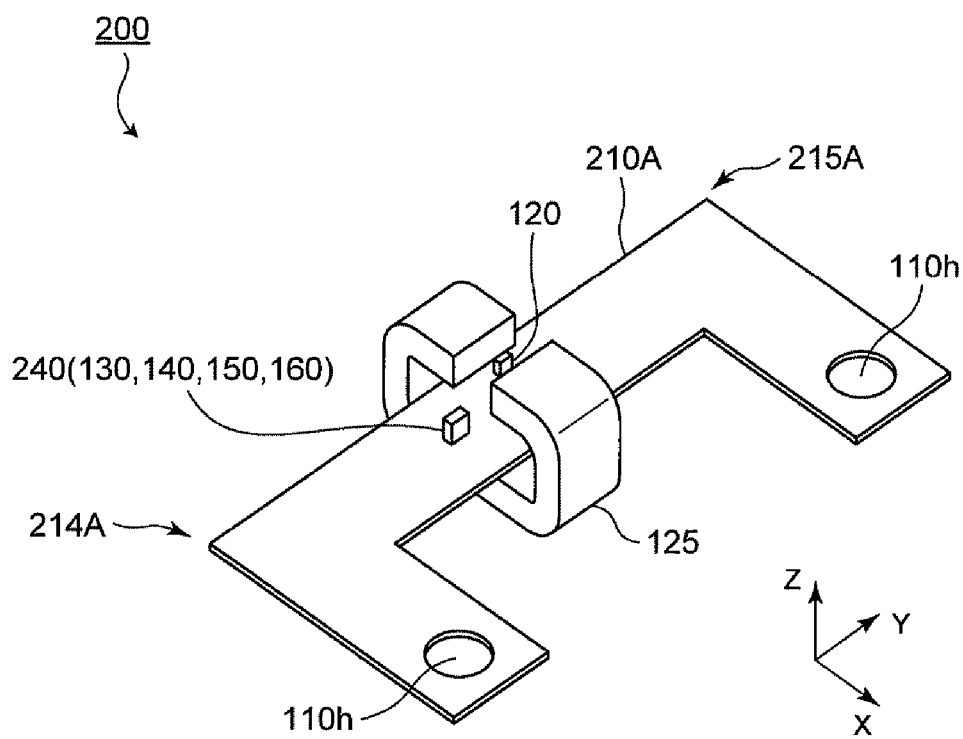
FIG. 22 is a perspective view illustrating the external appearance of a current sensor according to a first modified example of the seventh preferred embodiment of the present invention.
Figure 23:
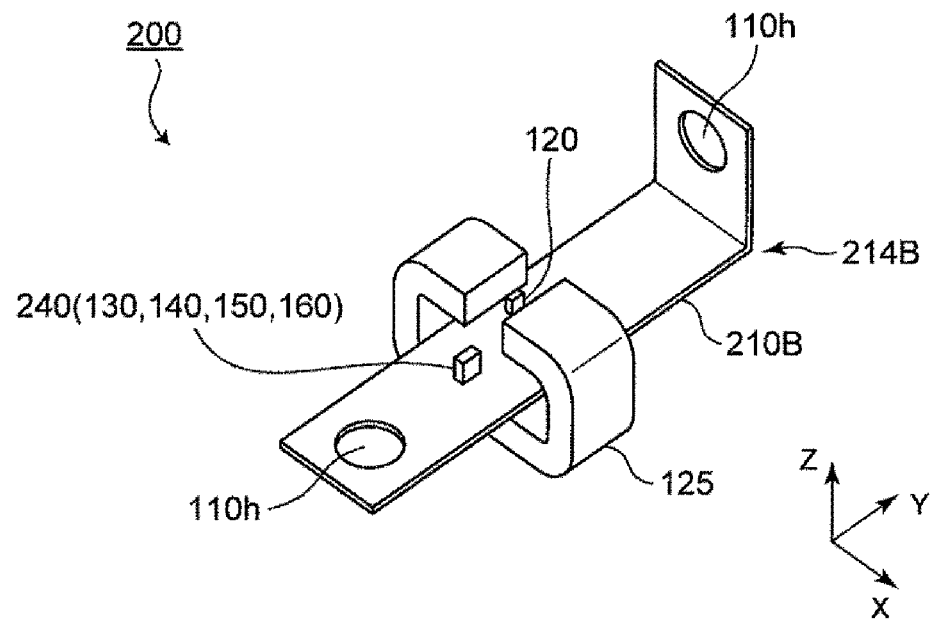
FIG. 23 is a perspective view illustrating the external appearance of a current sensor according to a second modified example of the seventh preferred embodiment of the present invention.
Figure 24:
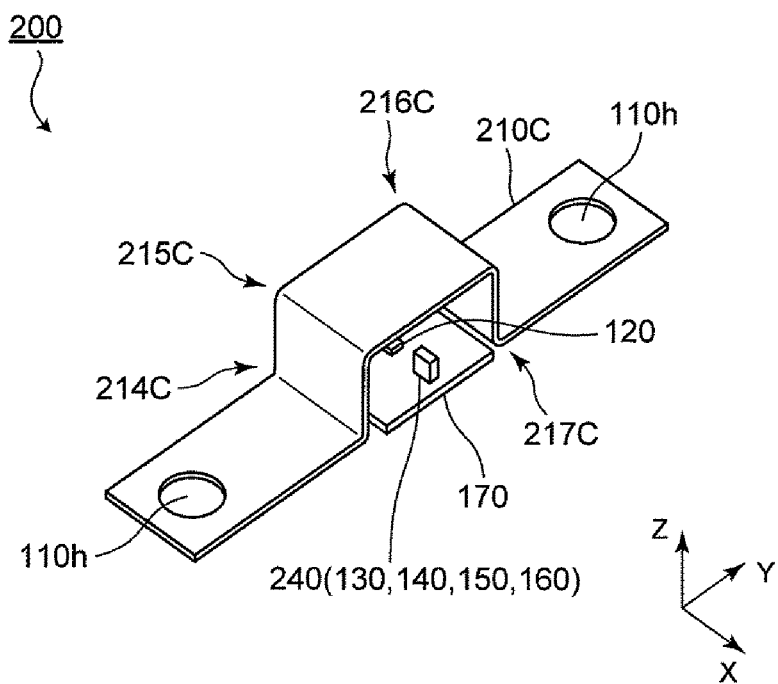
FIG. 24 is a perspective view illustrating the external appearance of a current sensor according to a third modified example of the seventh preferred embodiment of the present invention.

FIG. 22 is a perspective view illustrating the external appearance of a current sensor according to a first modified example of the seventh preferred embodiment. FIG. 23 is a perspective view illustrating the external appearance of a current sensor according to a second modified example of the seventh preferred embodiment. FIG. 24 is a perspective view illustrating the external appearance of a current sensor according to a third modified example of the seventh preferred embodiment.

As shown in FIG. 22, the current sensor 200 of the first modified example is different from that of the seventh preferred embodiment in that it includes a conductor 210A, instead of the conductor 210. The conductor 210A includes bending portions 214A and 215A which bend in the widthwise direction (X-axis direction).

As shown in FIG. 23, the current sensor 200 of the second modified example is different from that of the seventh preferred embodiment in that it includes a conductor 210B, instead of the conductor 210. The conductor 210B includes a bending portion 214B which bends in the thickness direction (Z-axis direction).

As shown in FIG. 24, the current sensor 200 of the third modified example is different from that of the seventh preferred embodiment in that it includes a conductor 210C, instead of the conductor 210. The conductor 210C includes bending portions 214C, 215C, 216C, and 217C which bend in the thickness direction (Z-axis direction). In the current sensor 200 of the third modified example, a magnetic sensor 120 and electronic components 240 are mounted on a substrate 170.

In the bending conductors 210A, 210B, and 210C, deformation is likely to occur due to an ambient temperature change. Thus, in the current sensors 200 including the bending conductors 210A, 210B, and 210C, the output voltage from the current sensor is likely to fluctuate because of the deformation of the conductor caused by an ambient temperature change. The present invention is thus suitably applicable to the current sensors 200 of the first through third modified examples of the seventh preferred embodiment.

Eighth Preferred Embodiment

A current sensor 300 according to an eighth preferred embodiment of the present invention is different from the current sensor 100 of the first preferred embodiment in the shape of first and second flow passages.

Figure 25:
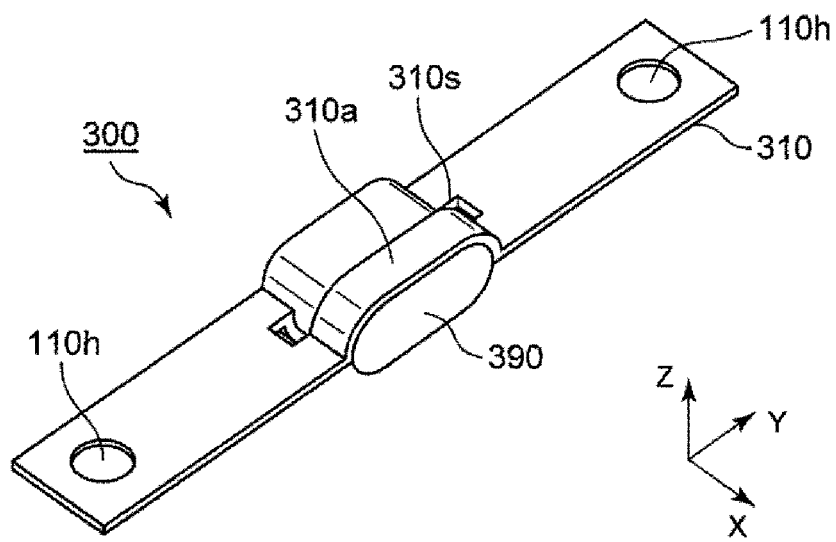
FIG. 25 is a perspective view illustrating the external appearance of a current sensor according to an eighth preferred embodiment of the present invention.
Figure 26:
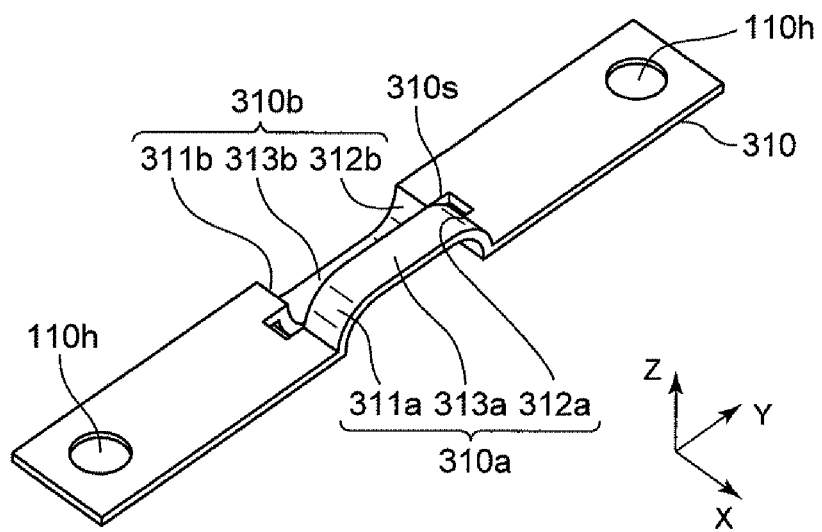
FIG. 26 is a perspective view illustrating the external appearance of a conductor of the current sensor shown in FIG. 25.
Figure 27:
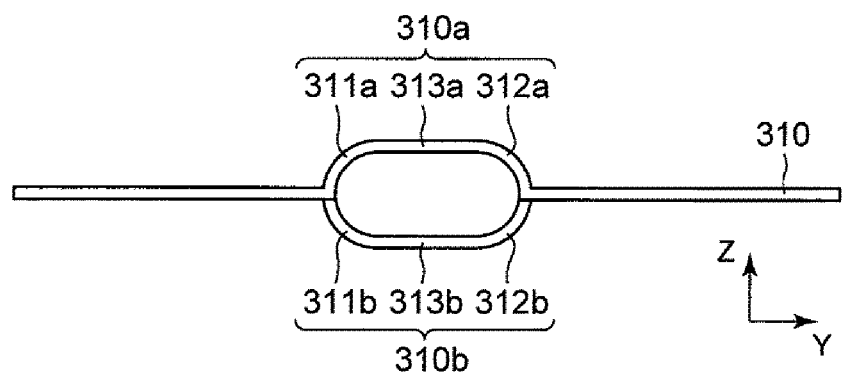
FIG. 27 illustrates the conductor shown in FIG. 26, as viewed from the widthwise direction (X-axis direction).

FIG. 25 is a perspective view illustrating the external appearance of the current sensor according to the eighth preferred embodiment. FIG. 26 is a perspective view illustrating the external appearance of a conductor of the current sensor shown in FIG. 25. FIG. 27 illustrates the conductor shown in FIG. 26, as viewed from the widthwise direction (X-axis direction).

The current sensor 300 of the eighth preferred embodiment includes a planar conductor 310 through which a current to be measured flows.

The conductor 310 is divided into first and second flow passages 310a and 310b at one portion in the lengthwise direction (Y-axis direction) of the conductor 310. The first and second flow passages 310a and 310b are side by side in the widthwise direction (X-axis direction) of the conductor 310. A slit 310s is provided between the first and second flow passages 310a and 310b. The slit 310s is positioned substantially at the central portion of the conductor 310 in the widthwise direction (X-axis direction). The first flow passage 310a protrudes toward the side of one surface (+Z direction side) of the conductor 310, while the second flow passage 310b protrudes toward the side of the other surface (−Z direction side) of the conductor 310.

The shape of each of the first and second flow passages 310a and 310b is preferably semi-elliptical, for example, as viewed from the widthwise direction (X-axis direction) of the conductor 310. The first flow passage 310a includes first and second protruding portions 311a and 312a and a first extending portion 313a. The first and second protruding portions 311a and 312a protrude from one surface of the conductor 310 in an arch shape. The first extending portion 313a extends in the lengthwise direction (Y-axis direction) of the conductor 310 so as to link the first and second protruding portions 311a and 312a. The second flow passage 310b includes third and fourth protruding portions 311b and 312b and a second extending portion 313b. The third and fourth protruding portions 311b and 312b protrude from one surface of the conductor 310 in an arch shape. The second extending portion 313b extends in the lengthwise direction (Y-axis direction) of the conductor 310 so as to link the third and fourth protruding portions 311b and 312b. With this configuration, the first and second flow passages 310a and 310b define a space. A magnetic sensor unit 390 is disposed in the space.

The first and second flow passages 310a and 310b are not limited to the above-described shape, and may have a C shape or a semi-circular shape, for example, as viewed from the widthwise direction (X-axis direction) of the conductor 310. The shapes of the first and second flow passages 110a and 110b are point-symmetrical to each other.

The magnetic sensor unit 390 is different from the magnetic sensor unit 190 only in the shape of the housing, and the internal configuration thereof is the same as or similar to that of the magnetic sensor unit 190.

With the current sensor 300 of the present preferred embodiment, advantages similar to those of the first preferred embodiment are able to be obtained. That is, the current sensor 300 of the present preferred embodiment is able to reduce output errors caused by an ambient temperature change to be smaller than the related art. It is thus possible to provide a high-precision current sensor.

Additionally, in the current sensor 300 of the present preferred embodiment, by providing the bending portions of the first and second flow passages 310a and 310b in a curved shape, the deformation of the first and second flow passages 310a and 310b due to an ambient temperature change is reduced. It is thus possible to reduce fluctuations in the output voltage from the first magnetic sensor 120a caused by the deformation of the first flow passage 310a and those of the second magnetic sensor 120b caused by the deformation of the second flow passage 310b. As a result, output errors of the current sensor 300 caused by an ambient temperature change are decreased.

Ninth Preferred Embodiment

A current sensor 400 according to a ninth preferred embodiment of the present invention is different from the current sensor 100 of the first preferred embodiment in the shape of first and second flow passages.

Figure 28:
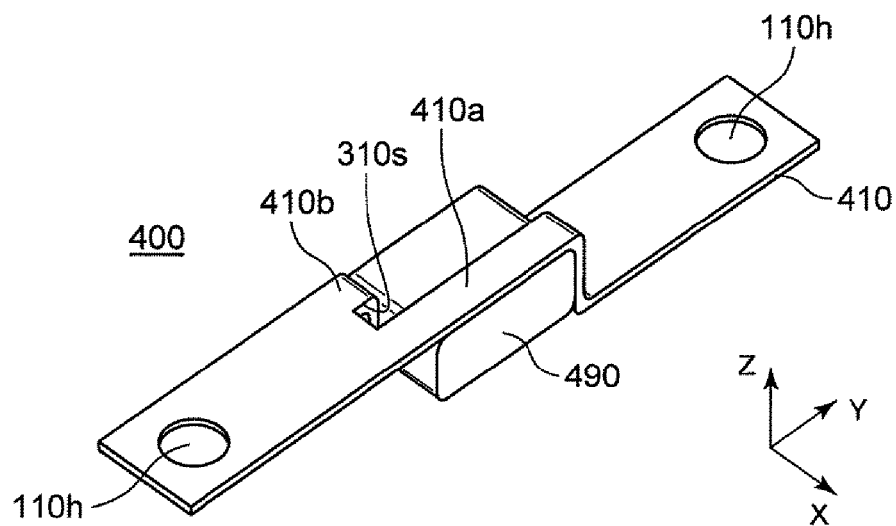
FIG. 28 is a perspective view illustrating the external appearance of a current sensor according to a ninth preferred embodiment of the present invention.
Figure 29:
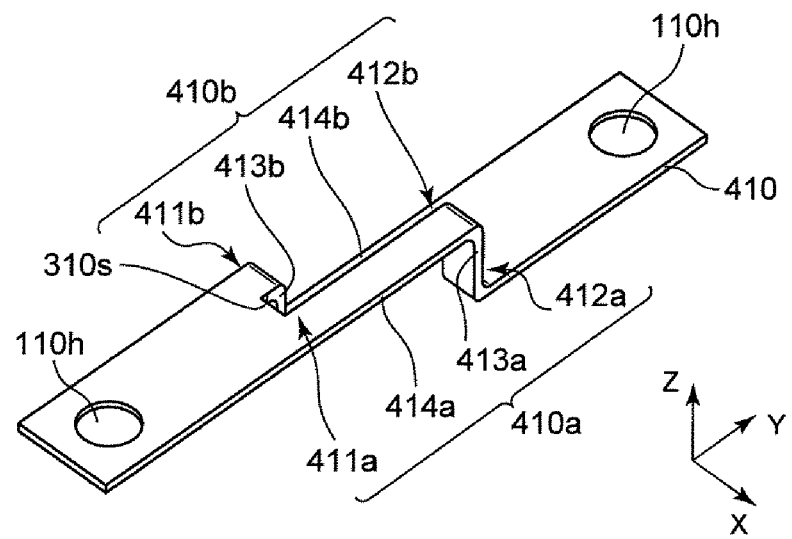
FIG. 29 is a perspective view illustrating the external appearance of a conductor of the current sensor shown in FIG. 28.
Figure 30:
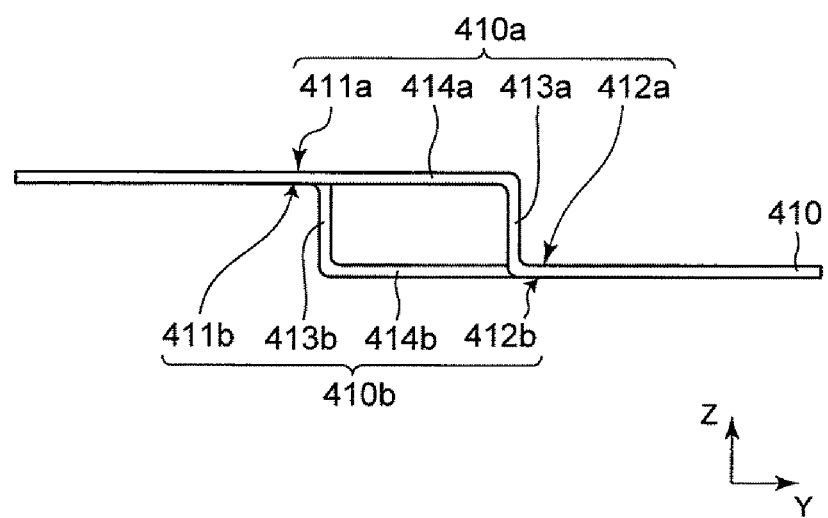
FIG. 30 illustrates the conductor shown in FIG. 29, as viewed from the widthwise direction (X-axis direction).

FIG. 28 is a perspective view illustrating the external appearance of the current sensor according to the ninth preferred embodiment. FIG. 29 is a perspective view illustrating the external appearance of a conductor of the current sensor shown in FIG. 28. FIG. 30 illustrates the conductor shown in FIG. 29, as viewed from the widthwise direction (X-axis direction).

The current sensor 500 of the ninth preferred embodiment includes a planar conductor 410 through which a current to be measured flows.

The conductor 410 is divided into first and second flow passages 410a and 410b at one portion in the lengthwise direction (Y-axis direction) of the conductor 410. The first and second flow passages 410a and 410b are side by side in the widthwise direction (X-axis direction) of the conductor 410. A slit 410s is provided between the first and second flow passages 410a and 410b. The slit 410s is positioned substantially at the central portion of the conductor 410 in the widthwise direction (X-axis direction). One end portion and the other end portion of the conductor 410 are located at different positions in the thickness direction (Z-axis direction). The first flow passage 410a includes a step portion have an L or substantially L shape, while the first flow passage 410a includes a step portion having an inverted L or substantially L shape.

The first flow passage 410a includes one end 411a and another end 412a in the lengthwise direction (Y-axis direction). The second flow passage 410b includes one end 411b and another end 412b in the lengthwise direction (Y-axis direction). The end 411a of the first flow passage 410a and the end 411b of the second flow passage 410b are disposed side by side in the widthwise direction (X-axis direction) with the slit 410s interposed therebetween. The other end 412b of the first flow passage 410a and the other end 412b of the second flow passage 410b are disposed side by side in the widthwise direction (X-axis direction) with the slit 410s interposed therebetween.

The first flow passage 410a includes an extending portion 414a and a bending portion 413a. The extending portion 414a extends from the end 411a in the lengthwise direction (Y-axis direction). The bending portion 413a linearly extends from a lengthwise-direction (Y-axis direction) end of the extending portion 414a to the other end 412a in the thickness direction (Z-axis direction). That is, the first flow passage 410a has a step shape. The second flow passage

410b includes a bending portion 413b and an extending portion 414b. The bending portion 413b linearly extends from the end 411b in the thickness direction (Z-axis direction). The extending portion 414b extends from a thickness-direction (Z-axis direction) end of the bending portion 413b to the other end 412b in the lengthwise direction (Y-axis direction). That is, the second flow passage 410b has a step shape. With this configuration, the first and second flow passages 410a and 410b define a space. A magnetic sensor unit 490 is disposed in the space.

The magnetic sensor unit 490 is different from the magnetic sensor unit 190 only in the shape of the housing, and the internal configuration thereof is the same as or similar to that of the magnetic sensor unit 190.

With the current sensor 400 of the present preferred embodiment, advantages similar to those of the first preferred embodiment are able to be obtained. That is, the current sensor 400 of the present preferred embodiment is able to reduce output errors caused by an ambient temperature change to be smaller than the related art. It is thus possible to provide a high-precision current sensor.

Tenth Preferred Embodiment

The current sensors according to the above-described first through ninth preferred embodiments are suitably used for measuring three-phase alternating currents in an in-vehicle inverter, for example. In the present preferred embodiment, an example in which the current sensor 100 of the first preferred embodiment is used to measure a three-phase alternating current will be discussed.

Figure 31:
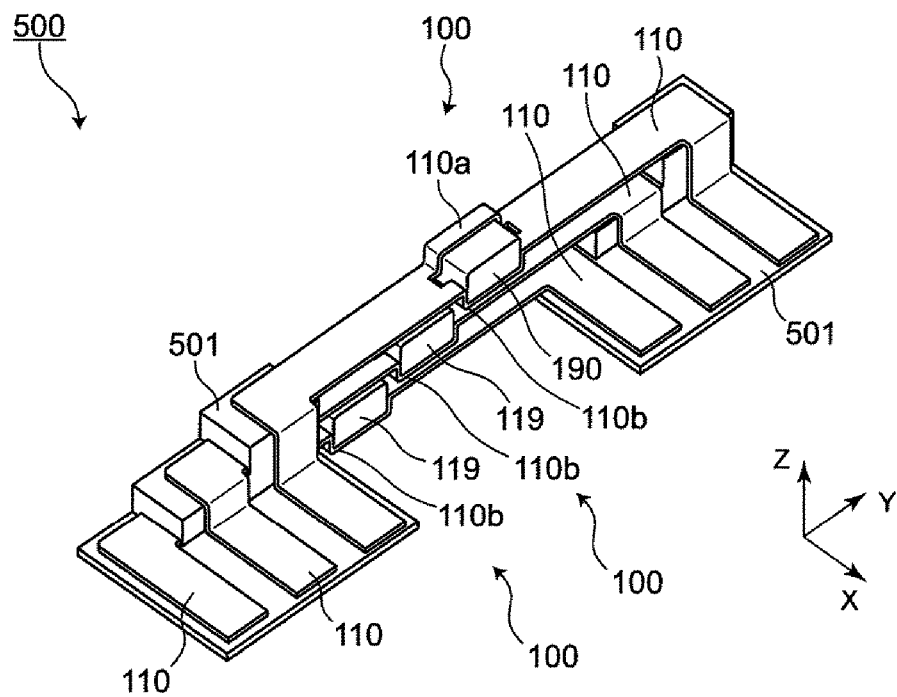
FIG. 31 is a perspective view illustrating the external appearance of a current sensor according to a tenth preferred embodiment of the present invention.
Figure 32:
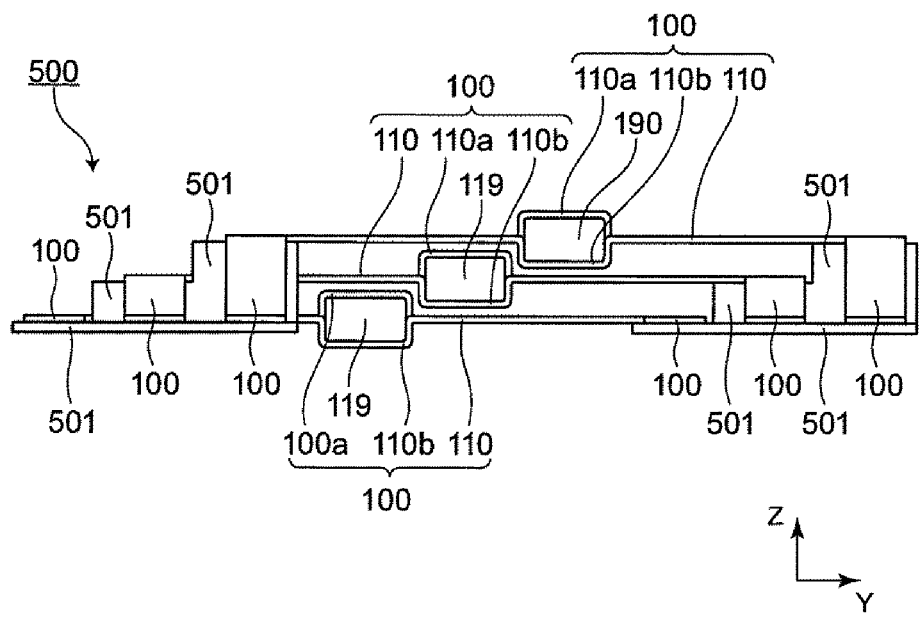
FIG. 32 illustrates the current sensor shown in FIG. 31 as viewed from the X-axis direction.

FIG. 31 is a perspective view illustrating the external appearance of a current sensor according to a tenth preferred embodiment of the present invention. FIG. 32 illustrates the current sensor shown in FIG. 31 as viewed from the X-axis direction. A current sensor 500 of the tenth preferred embodiment shown in FIGS. 31 and 32 includes a plurality of current sensors 100 that are fixed by resin members 501 and disposed adjacent to each other.

As described above, the current sensor 100 of the first preferred embodiment is able to reduce output errors caused by an ambient temperature change to be smaller than the related art, and the high-precision current sensor is thus able to be provided. When the current sensor 500 including the plurality of current sensors 100 is used to control a current in an inverter to drive a motor, the runaway of the inverter caused by an ambient temperature change is able to be prevented.

In this manner, when the current sensors 100 are used to detect a drive current in an inverter to control a drive current of a motor, the first and second correctors 140a and 140b may be mounted on a substrate disposed within a control device of the inverter. That is, the first and second correctors 140a and 140b may not necessarily be mounted on the substrate 170 on which the first and second magnetic sensors 120a and 120b within the magnetic sensor unit 190 are mounted. The mounting portion of the correctors in the above-described preferred embodiments is not restricted to the location described in the tenth preferred embodiment.

In the above-described preferred embodiments, electronic components, such as magnetic sensors, an amplifier unit, correctors, temperature sensors, and memories, for example, may be integrated and sealed in different packages. Alternatively, these electronic components may be integrated into one or a plurality of IC chips and be sealed in one or a plurality packages.

For example, in the first preferred embodiment, electronic components, such as the first and second magnetic sensors 120a and 120b, the amplifier unit 130, the first and second correctors 140a and 140b, the first and second temperature sensors 150a and 150b, and the first and second memories 160a and 160b, are sealed in different packages. However, these electronic components may be integrated into the same IC chip or be sealed in the same package.

Figure 33:
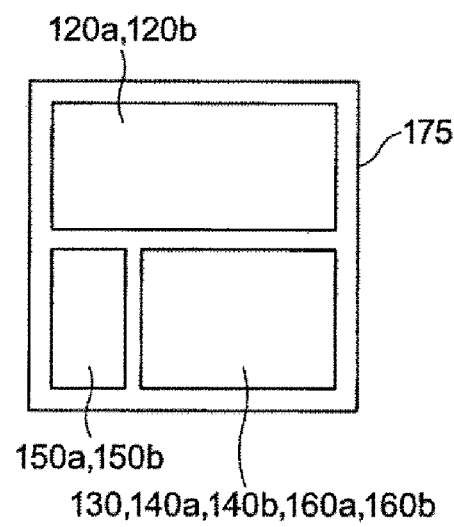
FIG. 33 illustrates an example of a package for electronic components in a current sensor.

FIG. 33 illustrates an example of a package for electronic components in a current sensor. In another preferred embodiment shown in FIG. 33, for example, the first and second magnetic sensors 120a and 120b are integrated into the same IC chip, the first and second temperature sensors 150a and 150b are integrated into the same IC chip, and the amplifier unit 130, the first and second correctors 140a and 140b, and the first and second memories 160a and 160b are integrated into the same IC chip. These IC chips are sealed in one package covered with a resin 175.

In the present preferred embodiment, by providing the first and second magnetic sensors 120a and 120b on the same IC chip, the characteristics of the first and second magnetic sensors 120a and 120b substantially match each other.

Figure 34:
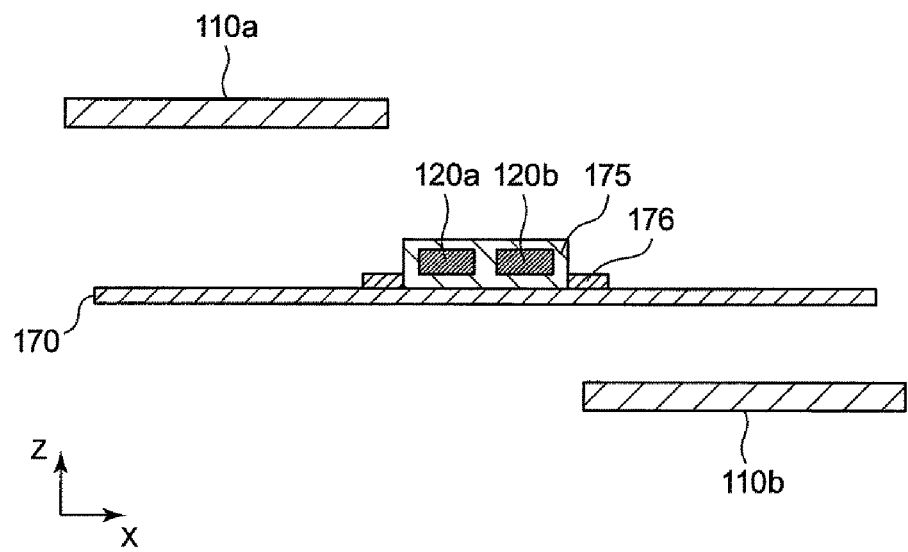
FIG. 34 illustrates an example of a package for electronic components in a current sensor.

FIG. 34 illustrates another example of a package for electronic components in a current sensor. As shown in FIG. 34, the first and second magnetic sensors 120a and 120b may be integrated into different IC chips and be sealed in one package covered with a resin 175. In FIG. 34, the first and second magnetic sensors 120a and 120b are electrically connected to a substrate 170 via leads 176 attached to the package. The package is disposed so that the central portion between the first and second magnetic sensors 120a and 120b matches that between the first and second flow passages 110a and 110b.

The present invention is not restricted to the above-described preferred embodiments. Changes, replacements, additions, and omissions may suitably be made to the above-described preferred embodiments. Additionally, the components described in the above-described preferred embodiments may be combined to provide different preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor which outputs an output signal in accordance with a magnitude of a current to be measured, the current sensor comprising:
    a conductor through which the current flows;
    a magnetic device that detects a strength of a magnetic field generated by the current and outputs an electric signal corresponding to the strength of the magnetic field as the output signal; and
    a corrector that corrects fluctuations in a magneto-electric conversion gain of the magnetic device caused by a change in an ambient temperature and fluctuations in the electric signal of the magnetic device caused by deformation of the conductor due to a change in the ambient temperature.

2. The current sensor according to claim 1, further comprising:
    a temperature detector that detects the ambient temperature; and a storage that stores a table in which a plurality of correction coefficients and individual ambient temperatures are associated with each other, the plurality of correction coefficients being used to correct fluctuations in the magneto-electric conversion gain of the magnetic device caused by a change in the ambient temperature and fluctuations in the electric signal of the magnetic device caused by the deformation of the conductor due to a change in the ambient temperature; wherein the corrector refers to the table and determines a correction coefficient associated with an ambient temperature detected by the temperature detector, and corrects the electric signal of the magnetic device based on the determined correction coefficient.

3. The current sensor according to claim 2, further comprising:

an amplifier unit that amplifies the electric signal of the magnetic device and outputs an amplified signal as the output signal; wherein the corrector changes an amplification gain of the amplifier unit.

4. The current sensor according to claim 2, wherein the corrector corrects the magneto-electric conversion gain of the magnetic device.

5. The current sensor according to claim 4, wherein the corrector adjusts a drive voltage or a drive current to be input into the magnetic device.

6. The current sensor according to claim 2, wherein the correction coefficient is calculated from a device correction coefficient and a conductor correction coefficient, the device correction coefficient being used to correct fluctuations in the magneto-electric conversion gain of the magnetic device caused by a change in the ambient temperature, the conductor correction coefficient being used to correct fluctuations in the electric signal of the magnetic device caused by the deformation of the conductor due to a change in the ambient temperature.

7. The current sensor according to claim 6, wherein, in a case in which the conductor is deformed to increase a distance from the magnetic device as the ambient temperature rises, the conductor correction coefficient is set to become larger as the ambient temperature rises.

8. The current sensor according to claim 7, wherein, in a case in which the conductor is deformed to decrease a distance from the magnetic device as the ambient temperature rises, the conductor correction coefficient is set to become smaller as the ambient temperature rises.

9. The current sensor according to claim 1, wherein the corrector includes a circuit device; and a device constant of the circuit device is determined so as to correct fluctuations in the magneto-electric conversion gain of the magnetic device caused by a change in the ambient temperature and fluctuations in the electric signal of the magnetic device caused by the deformation of the conductor due to a change in the ambient temperature.

10. The current sensor according to claim 1, wherein the conductor includes first and second flow passages divided from the conductor, a portion of the current flowing through the first flow passage, and a remaining portion current flowing through the second flow passage;

the magnetic device includes first and second magnetic devices, the first magnetic device detecting the strength of a first magnetic field generated by the current flowing through the first flow passage, the second magnetic device detecting the strength of a second magnetic field generated by the current flowing through the second flow passage; and the corrector includes first and second correctors, the first corrector correcting fluctuations in a magneto-electric conversion gain of the first magnetic device caused by a change in the ambient temperature and fluctuations in an electric signal of the first magnetic device caused by deformation of the first flow passage due to a change in the ambient temperature, the second corrector correcting fluctuations in a magneto-electric conversion gain of the second magnetic device caused by a change in the ambient temperature and fluctuations in an electric signal of the second magnetic device caused by deformation of the second flow passage due to a change in the ambient temperature.

11. The current sensor according to claim 10, wherein the first and second flow passages disposed side-by-side is a widthwise direction of the conductor.

12. The current sensor according to claim 11, wherein a slit is provided between the first and second flow passages.

13. The current sensor according to claim 10, wherein the first flow passage protrudes toward a side of a first surface of the conductor and the second flow passage protrudes toward a side of a second surface of the conductor opposite to the first surface.

14. The current sensor according to claim 13, wherein the first flow passage includes first and second protruding portions that protrude from the first surface of the conductor, and a first extending portion that extends in a lengthwise direction of the conductor and connects the first and second protruding portions; and the second flow passage includes third and fourth protruding portions that protrude from the second surface of the conductor, and a second extending portion that extends in a lengthwise direction of the conductor and connects the third and fourth protruding portions.

15. The current sensor according to claim 14, wherein the first and second protruding portions extend in a direction perpendicular or substantially perpendicular to the first surface, and the third and fourth protruding portions extend in a direction perpendicular or substantially perpendicular to the second surface.

16. The current sensor according to claim 14, wherein the first, second, third, and fourth protruding portions have a semi-elliptical shape.

17. The current sensor according to claim 10, wherein the first and second flow passages device a space therebetween, and the magnetic device is disposed in the space.

18. The current sensor according to claim 1, wherein the conductor is made of at least one of copper, silver, aluminum, iron, or an alloy of copper, silver, aluminum, and iron.

19. The current sensor according to claim 1, wherein the conductor includes bending portions that are bent in a widthwise direction of the conductor.

20. The current sensor according to claim 1, wherein the conductor includes bending portions that are bent in a thickness direction of the conductor.

* * * * *